United States Patent [19]
Hezel

[11] Patent Number: 5,449,626
[45] Date of Patent: Sep. 12, 1995

[54] METHOD FOR MANUFACTURE OF A SOLAR CELL

[76] Inventor: Rudolf Hezel, Hofheimer Strasse 12, D-8000 München 60, Germany

[21] Appl. No.: 268,575

[22] Filed: Jul. 6, 1994

Related U.S. Application Data

[62] Division of Ser. No. 990,766, Dec. 15, 1992, Pat. No. 5,356,488.

[30] Foreign Application Priority Data

Dec. 27, 1991 [DE] Germany ............ 41 43 083.2
Dec. 27, 1991 [DE] Germany ............ 41 43 084.0

[51] Int. Cl.$^6$ ........................... H01L 31/18
[52] U.S. Cl. ........................... 437/2; 437/225; 437/249; 437/180
[58] Field of Search ............ 437/2-5, 437/180, 225, 249; 136/256; 257/459, 466

[56] References Cited

U.S. PATENT DOCUMENTS

| | | | |
|---|---|---|---|
| 4,320,250 | 3/1982 | Corwin et al. | 136/256 |
| 4,367,368 | 1/1983 | Wolf | 136/255 |
| 4,886,555 | 12/1989 | Hackstein et al. | 136/255 |
| 5,053,083 | 10/1991 | Sinton | 136/256 |
| 5,112,409 | 5/1992 | Warfield et al. | 136/256 |
| 5,116,427 | 5/1992 | Fan et al. | 136/259 |

FOREIGN PATENT DOCUMENTS

| | | | |
|---|---|---|---|
| 0286917 | 3/1988 | European Pat. Off. | 136/255 |
| 1-66974 | 3/1989 | Japan | 136/256 |

OTHER PUBLICATIONS

Article Entitled "22.8% efficient silicon solar cell" by Andrew Blakers et al. Applied Phys. Ltrs. 55 (1989) 23 Sep. No. 13 New York, U.S. pp. 1363–1365.
Article from IEEE Photovoltaic Specialists Conference on May 4–8, 1987 in New Orleans, La. entitled "The Economic Payoff for a State-of-the-Art High-Efficiency Flat-Plate Crystalline Silicon . . . )" pp. 1424–1429.
Article entitled "26-Percent Efficient Point-Junction Concentrator Solar Cells . . . " by Andres Cuevas, et al. 8179 IEEE Electron Device Ltrs. 11 (1990) Jan. No. 1 New York.
Article entitled "Silicon solar cell with a novel . . . " by P. G. Borden 320 Applied Physics Ltrs. vol. 41 (1982) Oct. No. 7, New York pp. 649–651.
Article entitled "A reactive plasma process for forming metal grid patterns . . . " in 14th IEEE Photovoltaic Specialists Conf. (1980) by T. G. Sparks pp. 783–786.
Technical Digest article (5th Int'l Photovoltaic Science & Eng. Conf.) Nov. 26–30, 1990 in Kyoto Japan entitled "New a-Si Solar Cell with a V-grooved Glass Substrate" by Haruo Itoh et al. pp. 533–536.
Technical Digest article (5th Int'l Photovoltaic Science & Eng. Conf.) Nov. 26–30, 1990 in Kyoto Japan entitled "Advantages of Textured Multicrystalline Silicon for MIS Inversion Layer . . . )" by R. Hezel et al. pp. 701–704.

*Primary Examiner*—Aaron Weisstuch
*Attorney, Agent, or Firm*—Cushman Darby & Cushman

[57] ABSTRACT

A solar cell (10) with at least one semiconductor substrate surface (12) is proposed, having elevated areas (24, 26, 28) on which are provided electrically conducting contacts (20) for conducting charge carriers, and which are covered at least between the electrically conducting contacts by a passivation material (16). In order to manufacture solar cells with high efficiency using simple technology, the semiconductor substrate surface is completely or largely completely covered by the passivation material after formation of the elevated areas. Passivation material and if necessary semiconductor material present on the elevated areas is then removed from them. The material forming the electrically conducting contacts is then disposed on areas of the elevations thereby exposed.

13 Claims, 15 Drawing Sheets

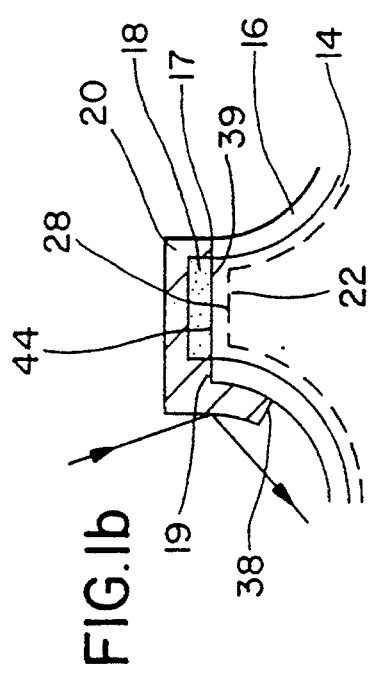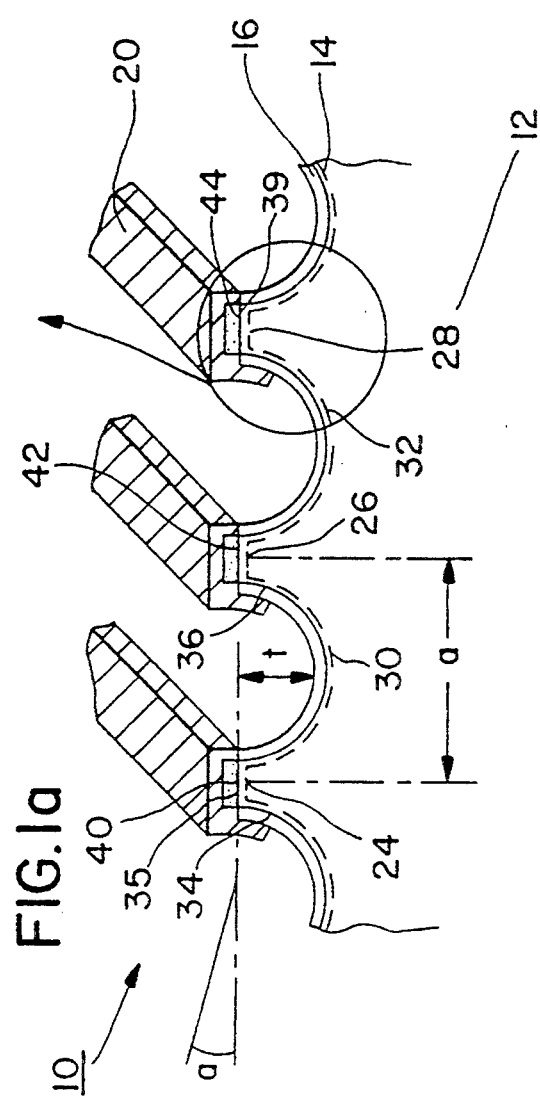

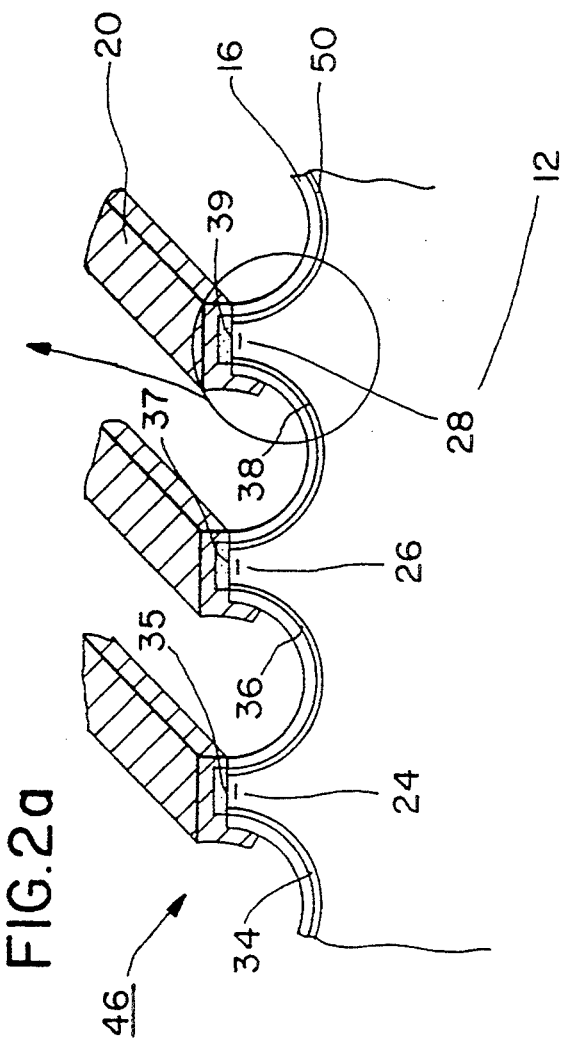
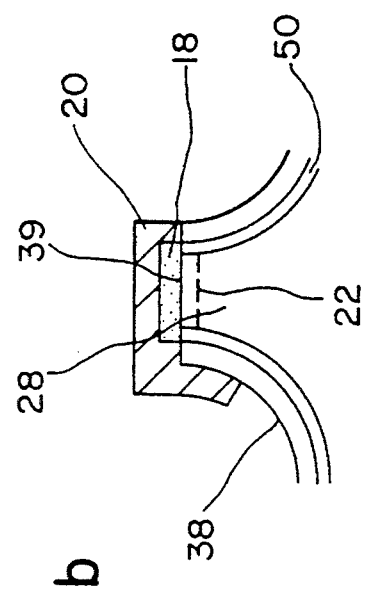
FIG.2a
FIG.2b

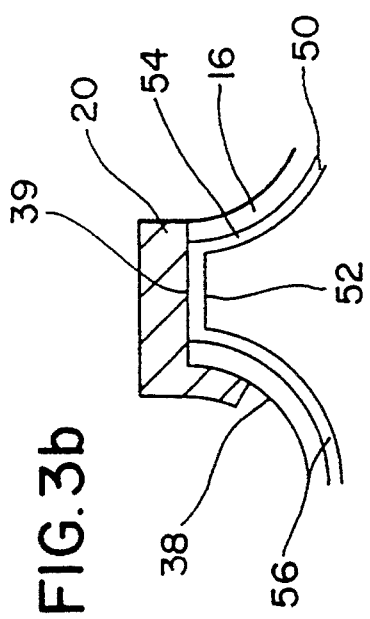
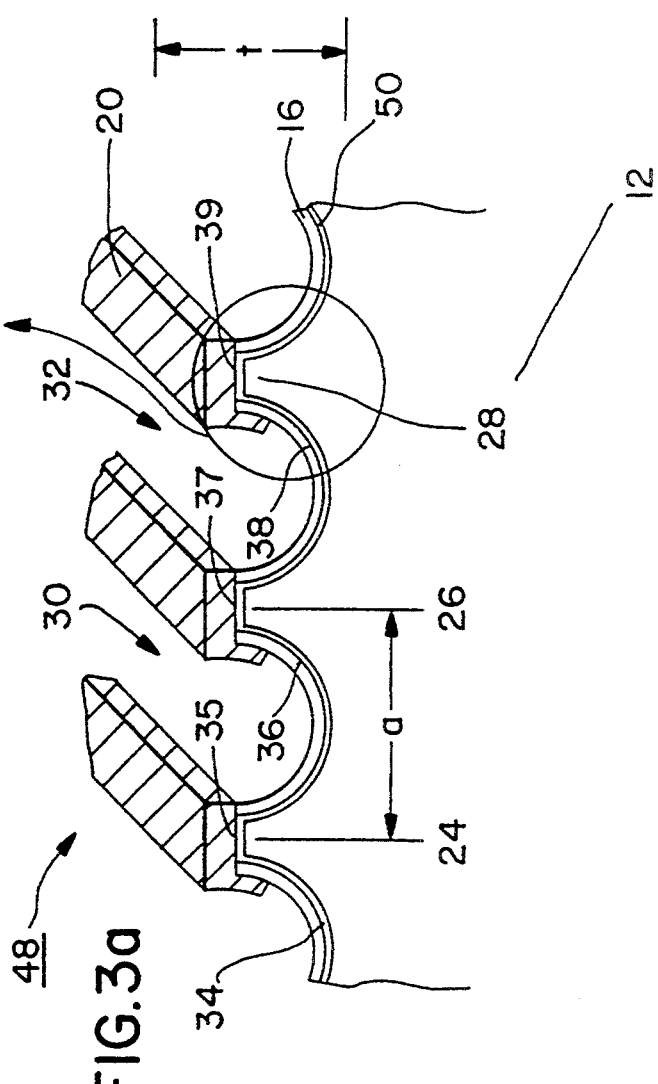

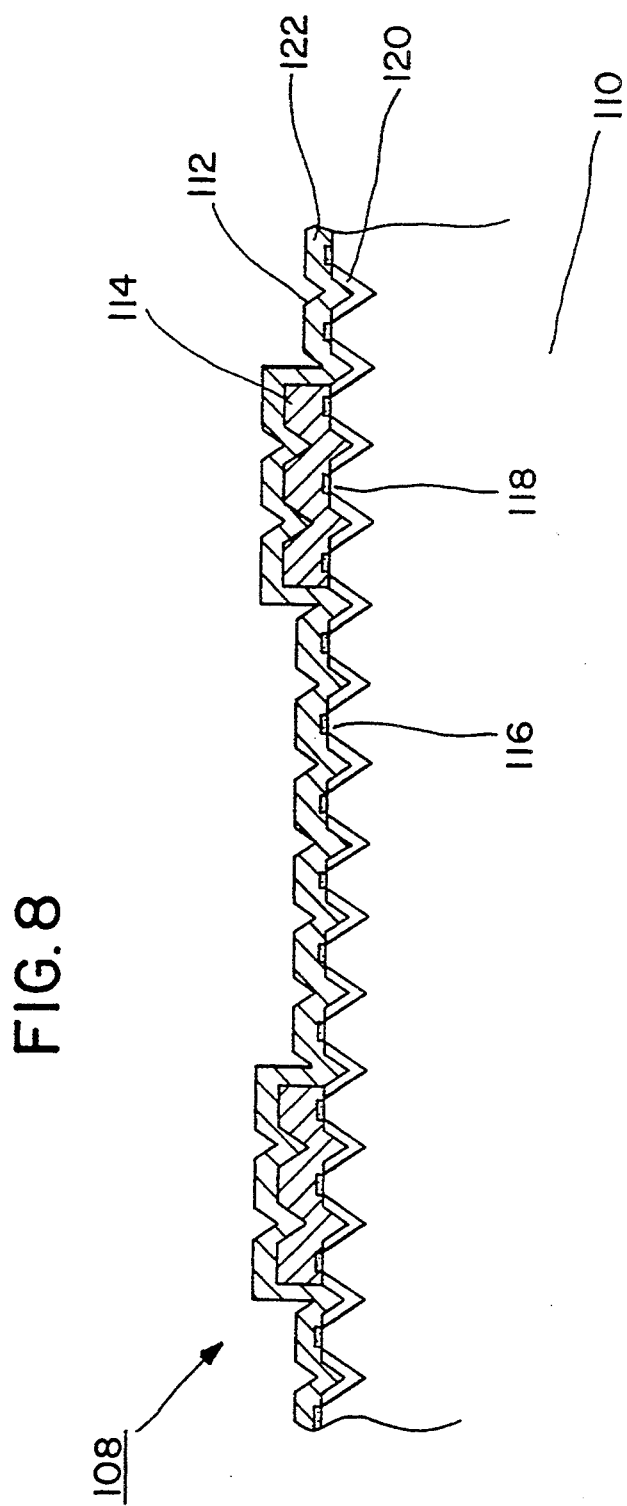

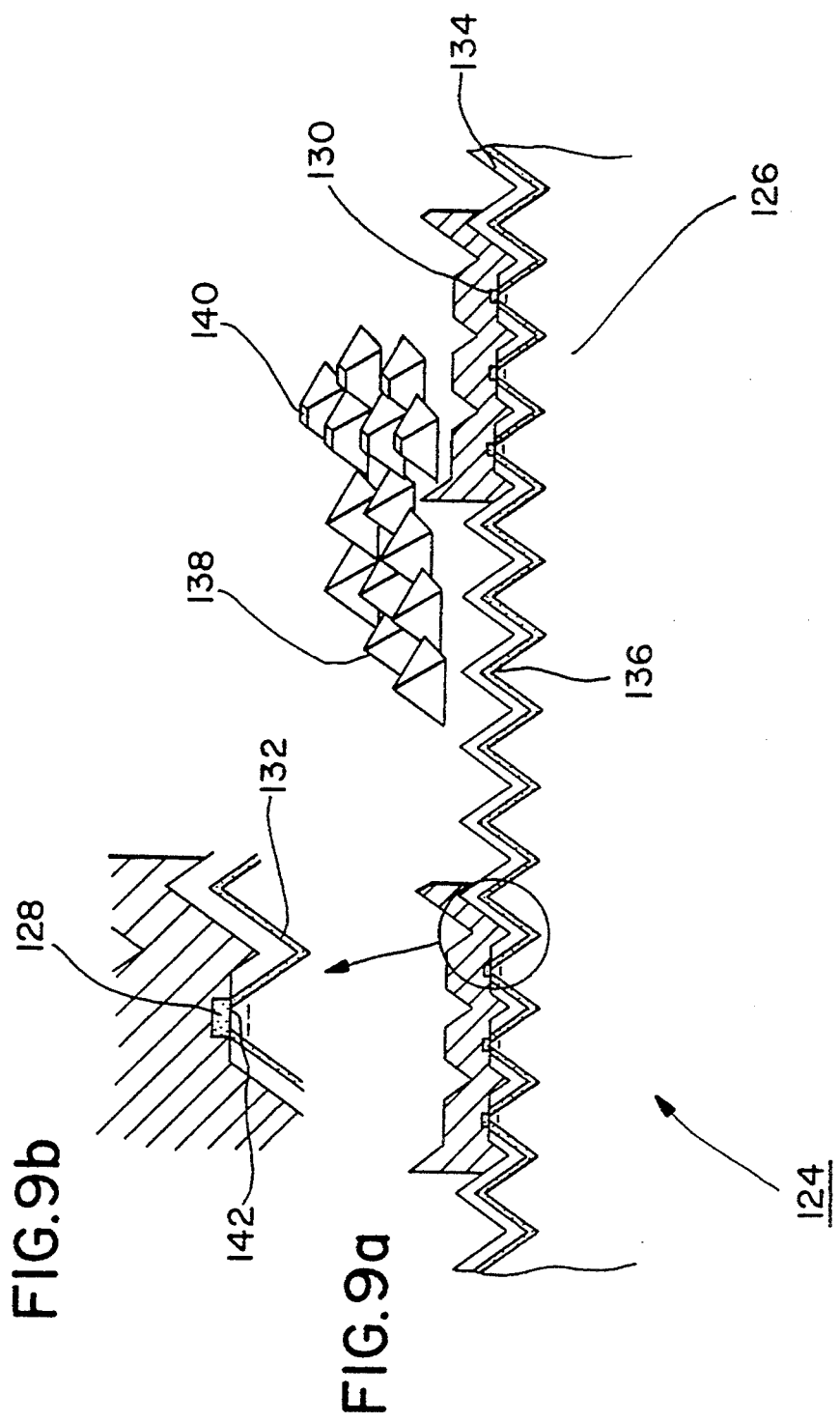

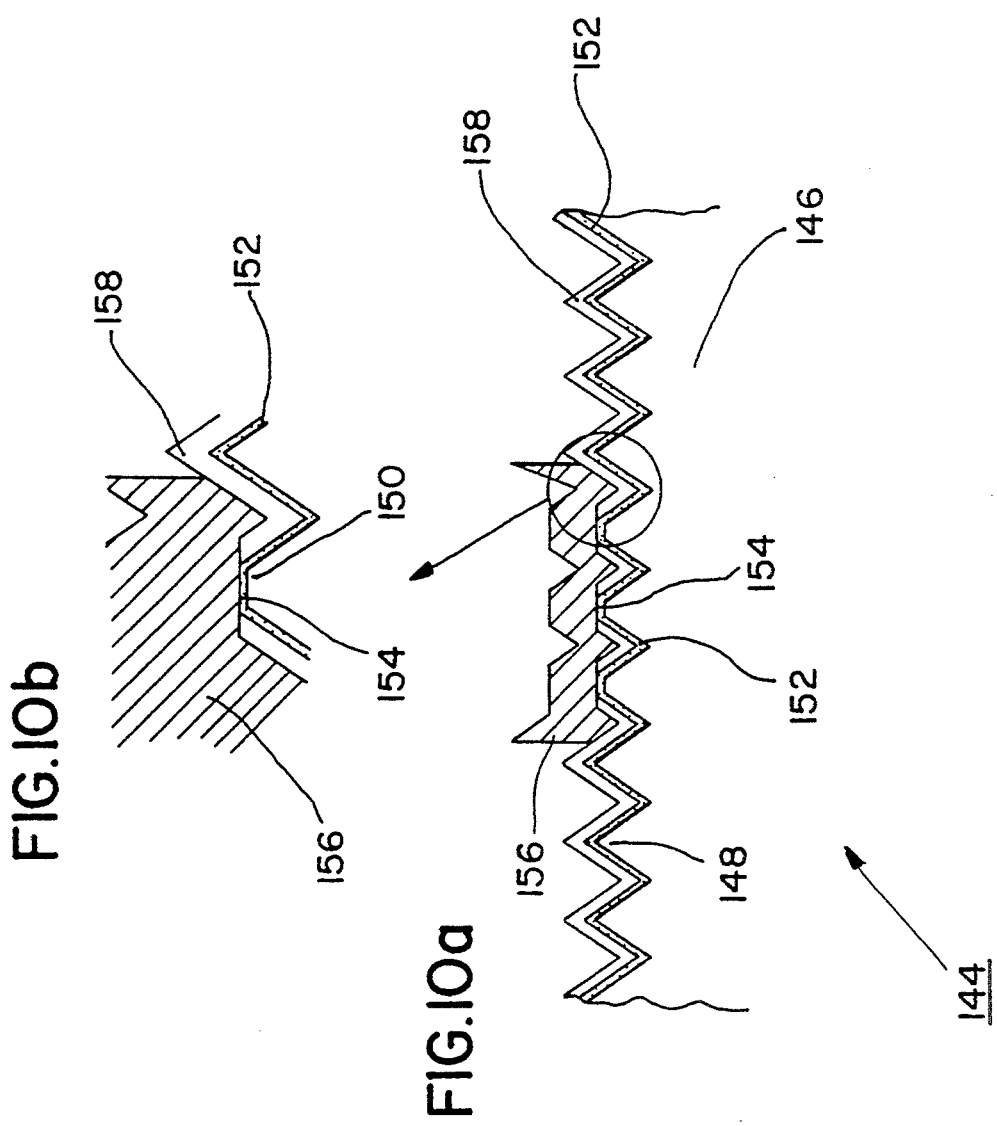

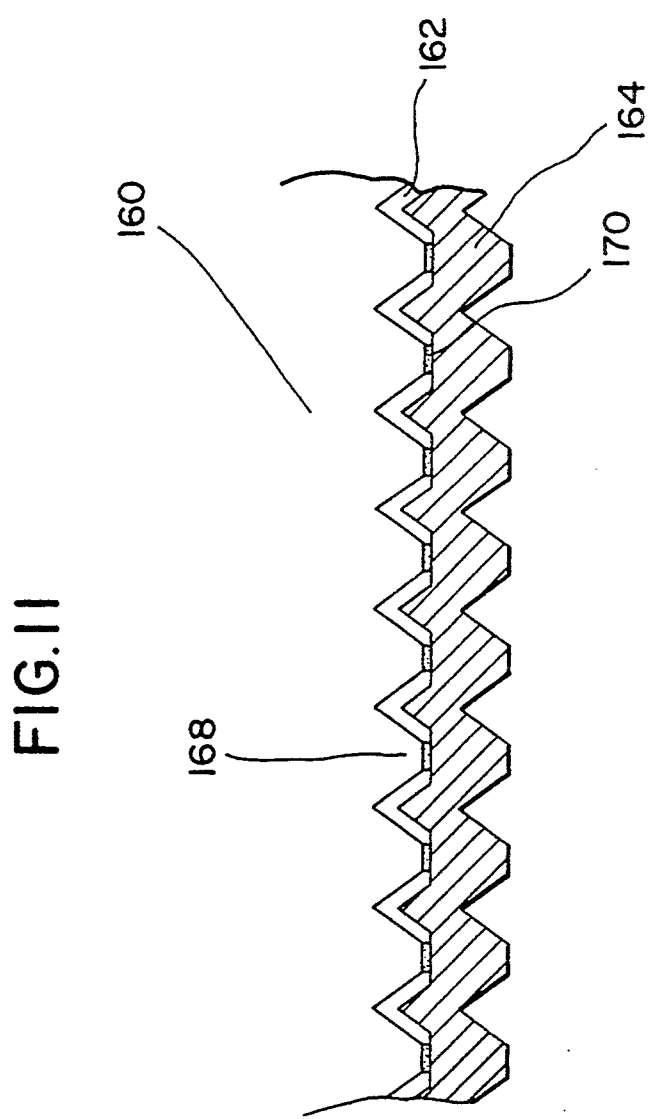

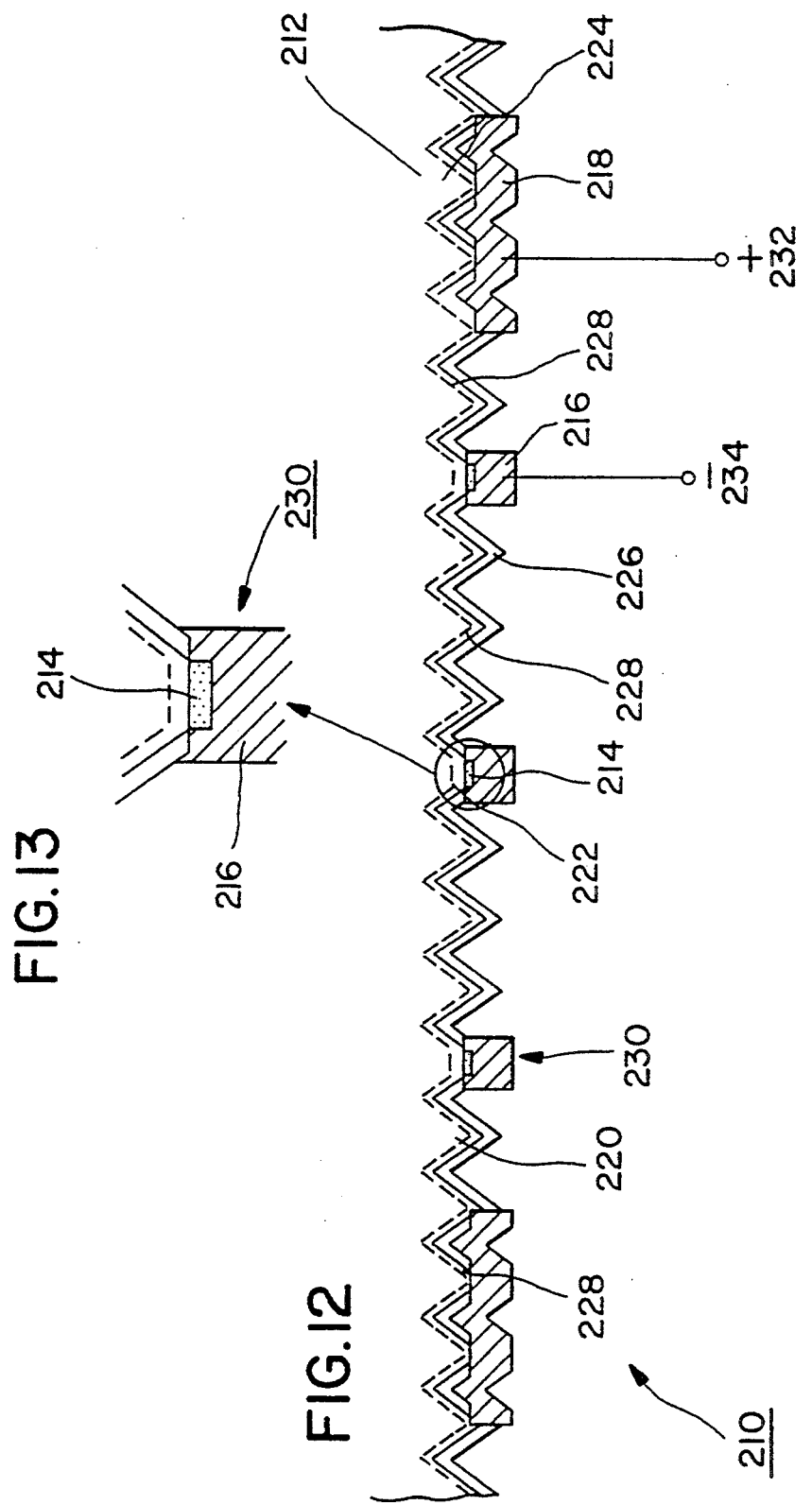

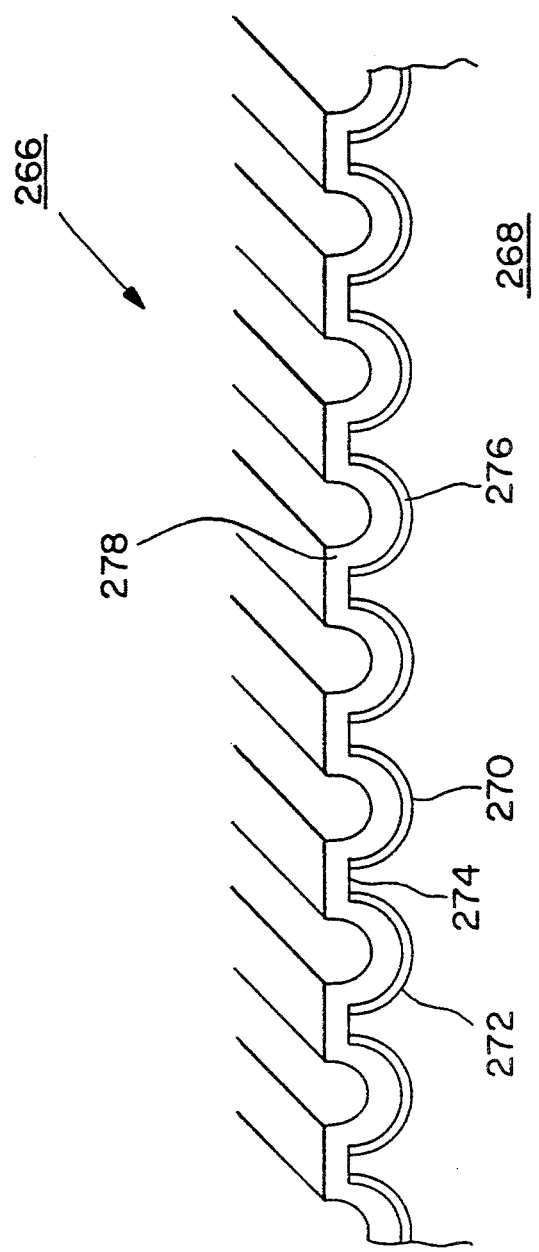

METHOD FOR MANUFACTURE OF A SOLAR CELL

This is a division of application Ser. No. 07/990,766, filed Dec. 15, 1992, U.S. Pat. No. 5,356,488.

The invention relates to a method for manufacturing a solar cell comprising a semiconductor substrate in which charge carriers can be generated by incident radiation energy as well as electrically conducting contacts for conducting said charge carriers, in which, for manufacturing the solar cell

- elevated areas are provided on at least one semiconductor substrate surface,
- after formation of the elevated areas the semiconductor substrate surface is completely or substantially completely covered with passivation material,
- passivation material present on the elevated areas is removed at least partially therefrom, and
- material forming the electrically conducting contacts is indirectly or directly disposed at least on the areas of the elevations thus exposed and on some areas on passivation material on flanks extending from the elevated areas.

The invention further relates to a solar cell comprising a semiconductor substrate in which charge carriers can be generated by incident radiation energy that are separable by an electrical field and then conductible via electrically conducting contacts, where

- elevated areas having flanks and provided with electrically conducting contacts for conducting charge carriers are formed on at least one semiconductor substrate surface,
- the semiconductor substrate surface is covered with a passivation material forming a passivation layer at least in the area between the contacts, and
- the contacts are disposed on the tip areas of the elevations previously covered by passivation layer material and then freed of this and if necessary of semiconductor material, and extend at least in some areas over passivation material along flanks.

Finally, the invention relates to a solar cell having a semiconductor substrate in which charge carriers can be generated by incident radiation energy and are conductible by first and second contacts disposed on one side of the semiconductor substrate and collecting minority or majority carriers respectively.

BACKGROUND OF THE INVENTION

The main conditions essential for achieving very high efficiencies in photovoltaic solar cells are, in addition to optimum entrapment of the light by suitable surface structuring and contact arrangement, above all as low as possible a contact area and excellent surface passivation in the active area of the semiconductor. As a result, the short circuit current and—by lowering of the reverse saturation current—both the no-load voltage and the fill factor of the solar cell are increased. The highest laboratory efficiencies at present (around 24%) for silicon solar cells made with a doped pn-junction are achieved with a complex photolithographically generated surface substrate, and with high-temperature passivation by means of a thermal silicon dioxide layer in which very small openings are provided in turn by photolithography and etching for the metal contacts necessary to conduct the charge carriers (M. A. Green, S. R. Wenham, J. Zhao, J. Zolper and A. W. Blakers, *Proceedings of 21st IEEE Photovoltaic Specialists Conference*, p. 207, 1990). A double diffusion in the contact area contributes to a further reduction in the reverse saturation current. The complex manufacturing process is probably however only of limited viability for inexpensive mass production of terrestrial solar cells.

In the literature article "R. Hezel, W. Hoffmann and K. Jaeger, *Proceedings of 10th E.C. Photovoltaic Solar Energy Conference*, page 511, Lisbon 1991", a noteworthy MIS inversion layer solar cell is described that leads to a reduction in the manufacturing costs while achieving a high efficiency. Manufacture is achieved by simple low-temperature processes thanks to the induced pn-junction, and is hence,, suitable above all for very thin embodiments, including bifacial ones (sensitive to light on both sides). To increase the efficiency of the solar cell even further, a drastic improvement of the surface passivation is also necessary in addition to a reduction in the contact area.

It is known that the quality of the silicon surface passivation, and hence its efficiency too can be increased by deposition of a plasma silicon nitride layer at around 450° C. (W. Bauch and R. Hezel, *Proceedings of 9th E.C. Photovoltaic Solar Energy Conference*, p. 390, Freiburg, 1989). However, this requires two photolithographic steps in order to generate openings in the passivation layer and for definition of the contact grid, and these steps are only practicable with great difficulty for inexpensive mass production and for large solar cell areas.

From *IEEE Electron Device Letters*, Vol. 11, No. 1, January 1990, New York, p. 6–8, A. Cuevas et al., a point contact concentrator solar cell is known in which texturing is achieved by photolithographic means. The solar cell surface has a large number of elevated areas of which only a few are covered in some areas by an electrically conducting material for forming a front contact. The electrically conducting material extends over areas of semiconductor material exposed in places and having a V-shaped cross-section, and in some areas over an oxide layer as a passivation layer. The electric:ally conducting material extends along both flanks of the elevated areas. Thanks to the photolithographic process steps, the manufacture of suitable cells is very complex and unsuitable for widespread commercial application on account of the high manufacturing costs, among other reasons.

A solar cell with strip-like front contacts is known from the 19th *IEEE Photovoltaic Specialists Conference*, May 4, 1987, New Orleans, La., USA, p. 1424–1429, D. B. Bickler et al. The contacts extend exclusively over plateau-like areas of the semiconductor substrate that are covered in some areas by an oxide layer. To produce the structure, a large number of photolithographic process steps are necessary.

Both the solar cells described before and those described last require a complex masking, adjustment and etching technology.

Etching methods and masking technology are also necessary in a solar cell known from *Applied Physics Letters*, Vol. 55, No. 13, Sep. 25, 1989, New York, USA, p. 1363–1365, A. W. Blakers et al., in which cell the front contacts are disposed in lines on an oxide layer having openings.

Structuring of a front surface of an MIS solar cell by anisotropic etching is also known (*5th International Photovoltaic Science and Engineering Conference*, Nov. 26, 1990, Kyoto, Japan, p. 701–704, R. Hezel et al.).

In the solar cell known from the 5th International Photovoltaic Science and Engineering Conference, Nov. 26, 1990, Kyoto, Japan, p. 533-536, H. Itoh et al., an a-Si solar cell substrate is applied to a prestructured glass carrier.

In Applied Physics Letters, Vol. 41, No. 7, Oct. 1, 1982, New York, USA, p. 649-651, P. G. Borden et al., a Si solar cell is described in which a front contact structured by etching and photolithography covers a CVD oxide layer.

According to 14th IEEE Photovoltaic Specialists Conference, Jan. 7, 1980, San-Diego, Calif., USA, p. 783-785, T. G. Sparks et al., a surface structure of a solar cell is generated by anisotropic etching, and front contacts are deposited thereon by plasma etching and by mechanical masks.

SUMMARY OF THE INVENTION

One problem underlying the invention was to manufacture very efficient solar cells by means of simple technology and if necessary using large-surface and in particular very simple processing methods, both by high-temperature and in particular by low-temperature processes. Applicability for all types of semiconductor had to be possible, both elemental and compound semiconductors, whether in monocrystalline form with any surface orientation, in polycrystalline form with any grain size and orientation, or in the amorphous state, in a self-supporting (thick) version as well as with thin-film semiconductors on a different substrate.

A further problem underlying the invention was to provide an easy-to-achieve arrangement of the first and second contacts on one side of the solar cell that can be used to advantage in particular for large-area, non-concentrating systems. This was to be possible both on the basis of pn-junctions generated by diffusion and on the basis of induction of an electrical field by a metal or by surface insulator charges. In addition, the incident light through a back surface double contact grid structure was also to be exploited, and finally a simple solar cell irradiated from both sides and collecting minority charge carriers on both sides was to be provided. The latter is used both for the best possible exploitation of the ambient scattered light and for very effective collection of the light-generated charge carriers, in particular when a less expensive semiconductor substrate with reduced diffusion length of the minority charge carriers is available.

The problem is substantially solved by the process in that
  the elevated areas are formed without masking by mechanical removal or etching off of the semiconductor material and
  at least the passivation material is removed from the elevated areas such that a plateau-like area is formed, from whose free upper surface the flanks extend and in which semiconductor material is exposed.

The material forming the electrically conducting contacts is here preferably deposited on the plateau-like area of the elevated areas without using a special mask, and on at least one flank of each elevated area provided with the material forming the electrically conducting contacts.

Furthermore, the initially posed problem is also solved by a solar cell characterized in that the passivation layer in the area of the elevation has at least in some areas a plateau-like area from which the flanks extend and in which the semiconductor material or a layer disposed thereon is exposed, and in that the material forming the electrically conducting contact extends over the plateau-like area and along at least one flank extending therefrom.

Solutions to the other problems provide for a solar cell having a semiconductor substrate in which charge carriers are generated by incident radiation energy that are conductible by first and second contacts disposed on one surface of the semiconductor substrate and collecting minority or majority carriers respectively, said contacts being characterized in that the first and second contacts are disposed on a semiconductor substrate surface having elevated areas, in that the first and second contacts are disposed at least in some areas on sections of the elevated areas previously covered with passivation material and then cleared of this material, directly or on an insulating layer (214) or on a surface-doped layer of the semiconductor material.

On the other hand, a corresponding solar cell is characterized in that the first electrically conducting contacts or areas formed by these contacts extend over the full surface or substantially over the surface area between the second electrically conducting contacts, and the first and second electrical contacts run on areas of the semiconductor substrate that differ in their heights.

The first and second electrically conducting contacts are preferably ohmic contacts and MIS contacts.

Embodiments are detailed both in the sub-claims and in the complete description of the invention.

By the theory in accordance with the invention, interconnected contact finger systems having a very small contact surface with the semiconductor, large: conductor cross-section and yet low obscuration can be generated without complex mask techniques and preferably by self-adjustment, i.e. without masking, and can be used for conducting minority or majority charge carriers on the front and/or back surface of the solar cell.

A further substantial feature of the inventive concept is that the active surface between the contacts forming a contact grid is covered by a transparent layer that minimizes the surface recombination speed of the semiconductor and doubles as an antireflexion layer. This layer is deposited in order to achieve optimum passivation properties before manufacture of the contacts and hence without any restrictions as regards temperature and duration of the process. The selection of usable layers is not restricted thereby.

A possible layer is the film designated as thermal silicon oxide and generated by oxidation at high temperatures ($>500°$ C., preferably $>700°$ C.) in the case of silicon, as utilized to date for high-efficiency solar cells. However, layers such as silicon nitride, silicon oxynitride, aluminum oxide can be provided on the semiconductor by other methods too, such as chemical vapor phase deposition (CVD), preferably plasma-enhanced. The favorable effect of highly active hydrogen incorporated into the layer or generated during the deposition reaction is to be exploited here for surface and volume passivation of the semiconductor.

The incorporation of electrical charges in the passivation layer near the semiconductor surface is also advantageous for passivation, as a result of which inversion or accumulation—depending on the prefix of the charges—is generated in the semiconductor (charge-induced passivation). To achieve as low as possible a surface state density at low manufacturing temperatures, silicon nitride tempered or deposited with plasma enhancement at temperatures between 300° C. and 500° C. with exploitation of incorporate hydrogen and positive insulator charges has proved very advantageous.

A fundamental concept of the present invention is to provide the semiconductor surface with a structure of parallel grooves, with the individual grooves being separated from one another by raised and where possible pointed semiconductor areas—the elevated areas. The passivation layer is generated over the full surface of the semiconductor thus structured, preferably in accordance with methods described above, said layer covering the entire surface with an even thickness. To expose the contact areas, the usually well-insulating passivation layer is cleared by minimal removal of the preferably upward-tapering, raised semiconductor ridges—the elevated areas. The contacts forming a contact finger structure are then selectively deposited by suitable metallization processes. The size of the semiconductor area freed of the passivation layer and hence the actual contact area can be set in simple manner by the depth of the removal in addition to the groove spacing selected when generating the grooves in the case of ridges that preferably widen towards the bottom.

In contrast to the prior art as described at the onset, a contact is deposited on every elevated area.

The grooves produced mechanically without masking between the raised areas preferably have a depth (spacing between groove bottom and tip of elevated area) between 25 μm and 200 μm. The spacing between the elevated areas themselves is preferably between 30 μm and 2000 μm, in particular between 50 μm and 300 μm. Particularly good results are obtained when the spacing between the elevated areas is between 1.5 and 10 times the depth of the grooved areas.

By the theory in accordance with the invention, not only is the possibility of simple selective removal of the passivation layer and subsequent selective application of the metal contact fingers ensured, but also the entrapment of light by the semiconductor is greatly improved by the surface structuring described, in the form of grooves or similarly recessed areas. The result is a dual function of the elevated areas.

A self-adjusting method such as the method of high vacuum angle evaporation can be advantageously used as the metallization process. This permits deposition, without mask and adjustment, of a relatively thick and extended metal layer on one side of the ridges, but a thin and narrow metal layer on the flat surface contact area due to the low evaporation angle. As a result, the intended small contact surface of the metal with the semiconductor is achieved with a large metal cross-section, and also low light obscuration by the metal fingers on account of the very steep flank area is automatically achieved. In addition, the light incidence on the metal fingers in the flank area is also reflected into the grooves and therefore very well exploited.

In angle evaporation, each elevated area obscures the facing flank of the following elevated area. However, the incidence angle for evaporation should be preferably selected so that the angle of incidence is in a range between 30° and 1° in a plane formed by the free upper surfaces of the elevated areas. Angle evaporation causes the formation of an asymmetrical contact that extends on one hand over the truncated plateau-like upper surface of the elevated area, inside which semiconductor material is exposed or a layer thereon or formed therefrom runs, and on the other hand along one of the flanks.

The width of the plateau-like area of the elevated area is always greater than double the thickness of the passivation layer covering the surface of the semiconductor substrate. The width of the plateau-like area is preferably between 200 nm and 10 μm.

Accordingly, by far the greater part of the electrically conducting contacts such as contact fingers for current conducting is, in accordance with the invention, not on the semiconductor but on the insulating passivation layer, and hence does not contribute to the increase in the reverse saturation current.

Metallization can be achieved by other methods with self-adjustment and without masking, in addition to vacuum angle evaporation. Electrolytic metal deposition or currentless metallization (electroless plating) is particularly suitable, since masking is achieved automatically by the passivation layer located laterally on the flanks. No metal is deposited initially on the insulating areas, so that this is predominantly located on the exposed horizontal ridge areas and finally, by lateral outward growth, partly on both sides of the steep passivated flanks, hence assuming a mushroom shape. This self-adjusting metallization method is particularly suitable for diffused, ion-implanted contact areas or contact areas doped by alloying.

A further very suitable self-adjusting method for forming the electrically conducting contacts provides for selectively immersing (dip coating) the structured surface after removal of the passivation layer into a conducting paste or metal bath, with only the top of the ridge with the free semiconductor surface and, depending on the immersion depth, also the passivated flank areas being covered with the metal. The respective metal finger cross-section is accordingly determined by the immersion depth, viscosity of the bath etc. and can be varied in wide areas without substantially affecting the light obscuration. Here too, additional reflection of the light into the grooves takes place, similarly to angle evaporation but on both sides of the ridge, and hence a very advantageous light entrapment is achieved. It is also possible to apply the metal paste using the "spin-on" method selectively to one side of the ridge tips and to the flat horizontal ridge areas.

The groove structure with the raised intermediate areas can be economically generated preferably by mechanical methods applicable over large areas without any masking (mechanical grooving). Methods applicable for large surfaces, for example sawing with one or more parallel sawblades (saw dicing), milling with suitably structured tools, or gang saws (multiblade sawing) are also suitable. The latter comprises a system with many parallel metal strips, whose sawing cross-sections can have any shapes (angular, round, rounded corners etc.).

The arrangement of the various metal blades and their structuring permits the production of certain groove patterns with interruptions of the various grooves. Structures of this type can, for example, be important for the attachment of the main conductor of the current (bus bar) in solar cells.

Thanks to the minor sawing damage and other benefits, wire sawing using a system of parallel wires (multi-wire sawing) is particularly suitable for surface structuring. This method has been introduced successfully in recent years for sawing semiconductor blocks into thin wafers. The selection of the appropriate slurry is also important. When appropriate wire diameters and wire spacings are used, rounded grooves of differing width, depths and spacing, i.e. with different contact area widths, can be generated simply and over large areas. The grooves can however also be almost rectangular in cross-section, with very steep flanks and flat bottoms, with rounded corners; elliptical in cross-section or also tapering to a point. Structuring with parallel wires, for which the term "wire grooving" has been coined, can be achieved using both diamond-tipped wires and smooth wires in which the abrasive agent is in a liquid slurry.

The concept of surface structuring in accordance with the invention is however not only limited to semiconductor material for solar cells, indeed this concept is generally applicable for structuring of material in order to generate grooves that run parallel or substantially parallel to one another and hence also provide elevated areas between these grooves. For this purpose, the material is structured by mechanical structuring elements running parallel or substantially parallel to one another and moved relative to the material to be structured. The structuring elements are, as already mentioned, preferably wires and sawblades and also a gang saw. It goes without saying that a single wire, positioned appropriately to form parallel sections, can also be used instead of several wires.

Possibilities for using this method exist particularly in the optical industry for structuring glasses.

To reduce the light reflection, the groove bottom in particular and if necessary the walls, at least in some areas, can be specially structured additionally, with the known texturing method using an etchant preferably removing a certain crystal plane being shown only as an example. When a (100)-oriented semiconductor surface is available, non-textured flat flanks (for reflection of the light into the grooves, particularly when the flanks are partially covered with metal) and textured groove bottoms can be advantageously obtained using this method. The narrow horizontal contact areas can also be advantageously textured, as a result of which point contacts are produced in accordance with what is set forth below.

The preferably large-surface removal of the passivation layer noteworthy in accordance with the invention, and if necessary of a part of the semiconductor material in the area of the very narrow elevated areas forming the later contact areas, can be achieved particularly advantageously by mechanical methods in addition to other methods. Uniform lapping, milling, grindings and brushing over lathe surfaces, using, for example, fan-type grinding, brush rollers, grinding rollers, polishing rollers etc. may be mentioned, with wire lapping and milling with the aid of one or more wires being noteworthy here, again on account of only slight surface damage to the semiconductor. In the latter proposal, a high throughput can be achieved in simple manner by passing the semiconductor wafers continually under one or more moving wires with appropriate spacing.

In addition to mechanical methods for local removal of the passivation layer from the raised areas, specially developed wet-chemical methods or preferably dry-etching methods, for example with directed etching removal (plasma etching, ion etching, laser etching etc.), can be used.

For example, a particle beam or laser beam aimed parallel to the surface can etch away mainly, and without heavy damage, the raised areas together with the passivation layer to the required extent, without the need for adjustment or masking. Plasma etching through a mechanical mask is also feasible.

The theory in accordance with the invention, for generation of raised contact areas from which the passivation layer can in simple manner be removed selectively and the contact metal deposited, relates not only to relatively thick self-supporting semiconductor wafers in which grooves are provided. This principle can also be applied for thin-film semiconductors or thin-film solar cells deposited on a foreign substrate,.. For this purpose, the groove structure is already worked into the foreign substrate, which generally consists of metal (mostly with a diffusion barrier layer on top), of conducting or insulating ceramic material, of graphite, or of similar materials. In the semiconductor layer deposited onto it, which can generally consist of polycrystalline or amorphous silicon or of compound semiconductors, the solar cell including the passivation layer is generally built up, and in accordance with the inventive concept the passivation layer is removed from the raised areas and contact metallization is performed preferably using a self-adjusting method described above. An embodiment of the thin-layer solar cells is described further below.

In particular, it is provided in accordance with the invention that a required structure, in particular a grooved structure of the solar cell, is achieved by depositing the semiconductor material on an already structured substrate that doubles as the back contact. To prevent foreign substances from the carrier substrate diffusing into the semiconductor material, the substrate structured in accordance with the previously described method is covered by a layer acting as a diffusion barrier, such as silicon nitride or aluminum oxide. The layer is then removed from the tip areas of the elevations—also using the methods already described—in order to provide small contact areas for the semiconductor layer then to be applied. The solar cell can be then built up following the proposals in accordance with the invention.

It goes without saying that in the excellently passivated solar cells in accordance with the invention, the application of the self-adjusting metallization can be dispensed with and instead the metal can be deposited in the conventional manner, for example by vacuum deposition through a mechanical mask, by screen printing or by other methods. To do so, the passivation layer is removed from the raised areas either selectively, only in the area of later metallization, or over the full surface. In the latter case, however, the raised areas of the active solar cell surface that were previously free of the passivation layer but not covered by the metal must be passivated at low temperatures compatible with the metal contact after the metal fingers usually produced in strip form. The advantage of the latter configuration compared with conventional cells is that the major part of the semiconductor surface is provided with an excellent passivation, and hence high efficiencies can be achieved thanks to the very small contact area.

The theory in accordance with the invention for generating raised semiconductor areas and for selective removal of the passivation layer from these contact areas can also be advantageously extended to simple manufacture of new types of extremely well passivated point contact solar cells. It is possible in accordance with the invention, and with simple technology, to use optimum passivation layers such as thermal silicon dioxide or plasma silicon nitride produced or after-treated at temperatures from 800°14 1000° C. or 400°-500° C., since their preparation can take place before contact manufacture. It is provided in accordance with the invention that on a monocrystalline silicon surface covered with pyramids of adjustable size, first the passivation layer is generated over the full surface, then the silicon is exposed as small rectangular areas (truncated pyramids) by defined removal of the pyramid tips (preferably by grinding or lapping), and finally the metal is deposited over the full area or in strips. The size of the contact areas can be increased as required by varying the depth of removal of the pyramid tips thanks to the outwardly tapering shape of the pyramids, up to a 100% metal covering with complete removal of the pyramids.

The surface density of the pyramids and hence of the point contacts can be selectively varied by the height of the pyramids. As the height increases, the number of pyramids per surface unit decreases. The pyramids or differently shaped raised areas can be generated by anisotropic etching, as used for example for the texturing of solar cells to reduce light reflection. For silicon, alkaline solutions at increased temperature can be used that have differing etching rates for various crystal orientations. The height and density of the pyramids can be adjusted without masking by this texture etching process.

In this way, contact density and area can be regulated simply and to any value required.

Further details, advantages and features of the invention are given not only in the claims and in the features they describe—singly and/or in combination—but also in the following description of a preferred embodiment as shown in the drawings.

BRIEF DESCRIPTION OF FIGURES OF DRAWING

In the drawings,

FIG. 1a shows a section through an MIS inversion layer solar cell,

FIG. 1b shows a detail of the MIS inversion layer solar cell as per FIG. 1a,

FIG. 2a shows a section through a solar cell with pn-junction and MIS contacts,

FIG. 2b shows a detail of the solar cell as per FIG. 2a,

FIG. 3a shows a section through a further solar cell with pn-junction,

FIG. 3b shows a detail of the solar cell as per FIG. 3a,

Figure 5:
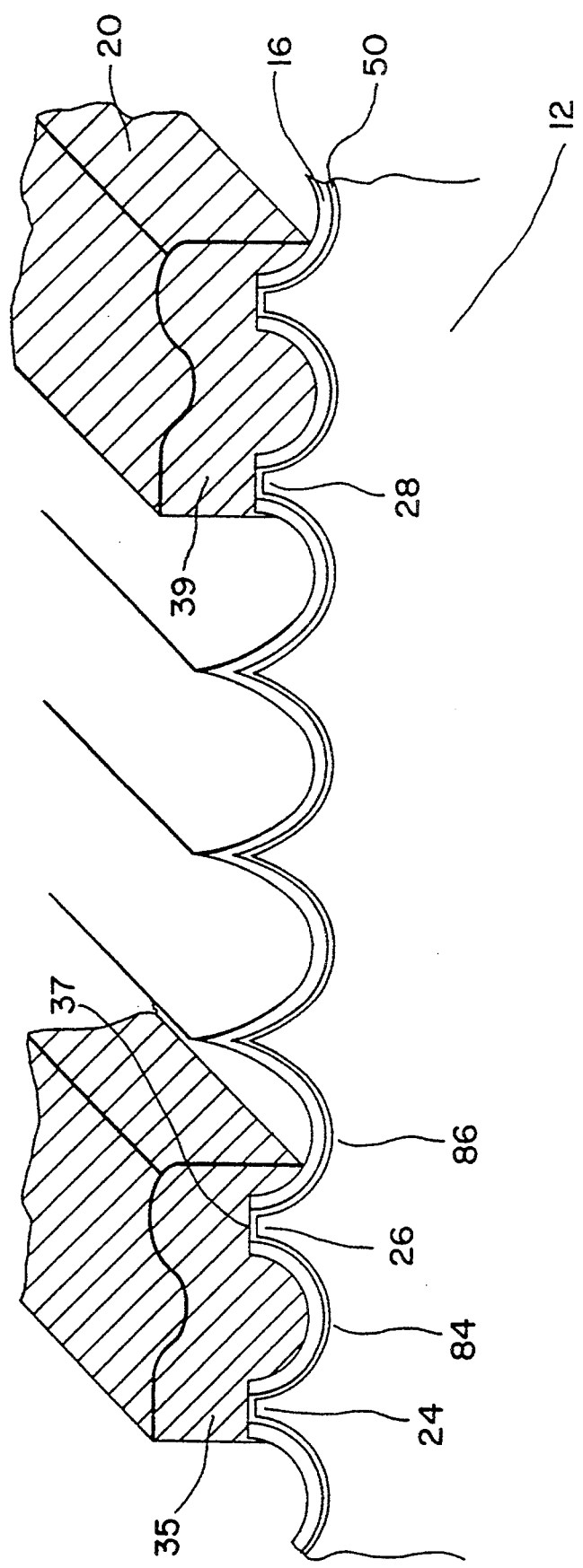
FIG. 5 shows a section through a further embodiment of a solar cell.
Figure 6:
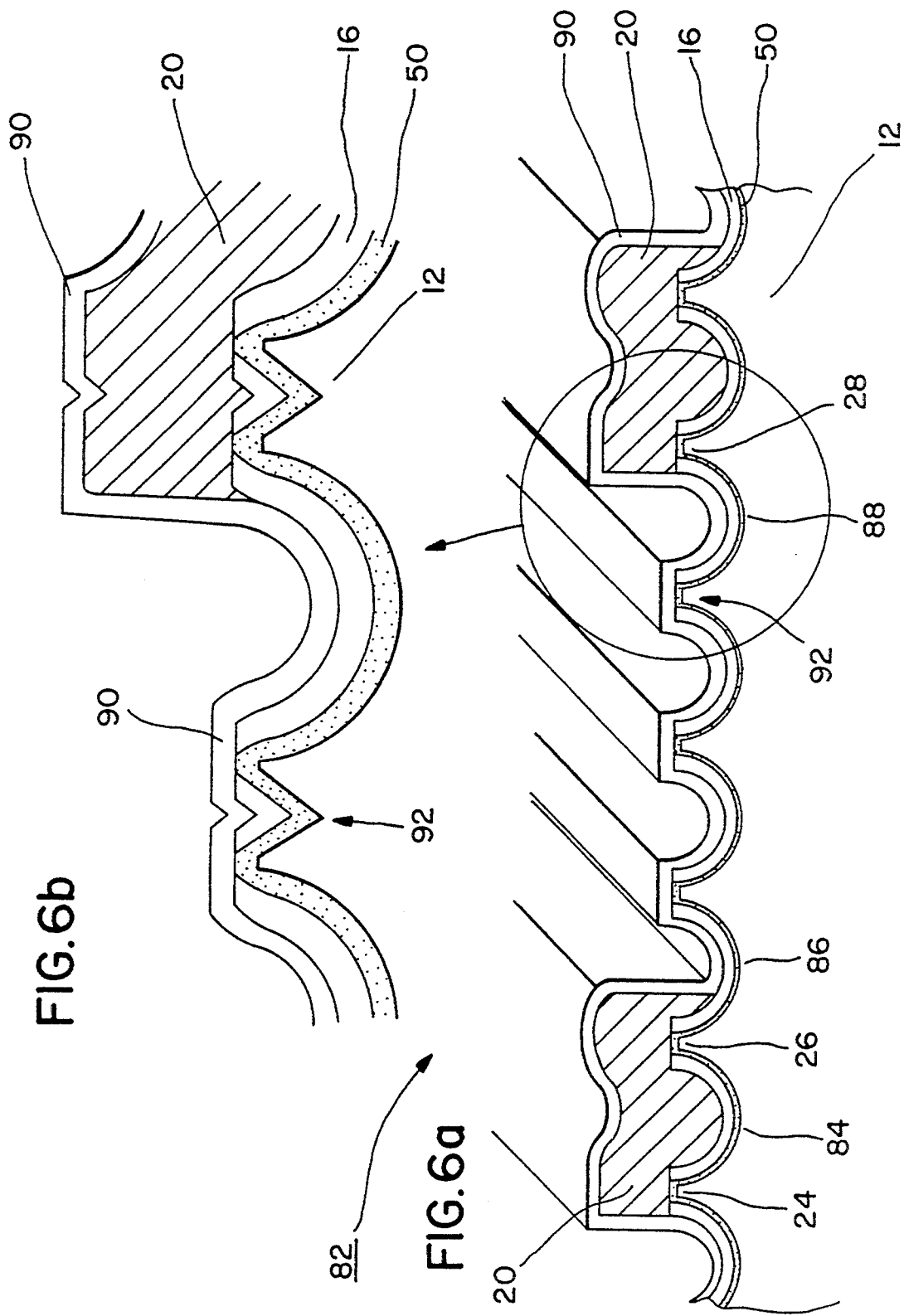
Figure 7:
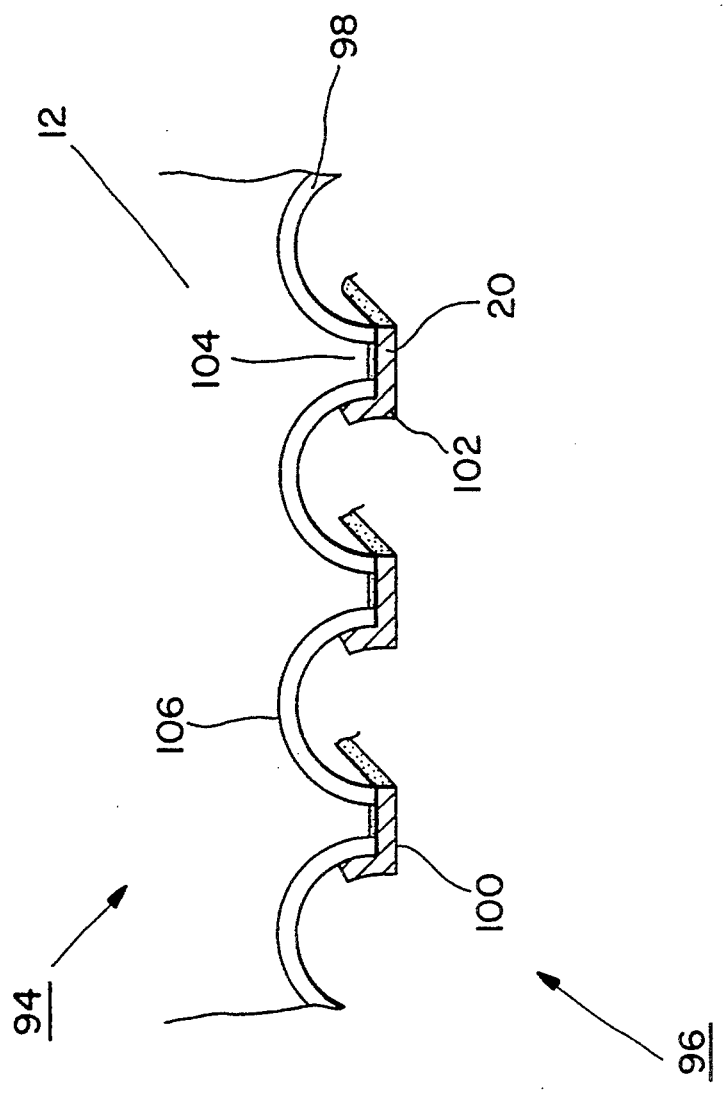
Figures 14, 15:
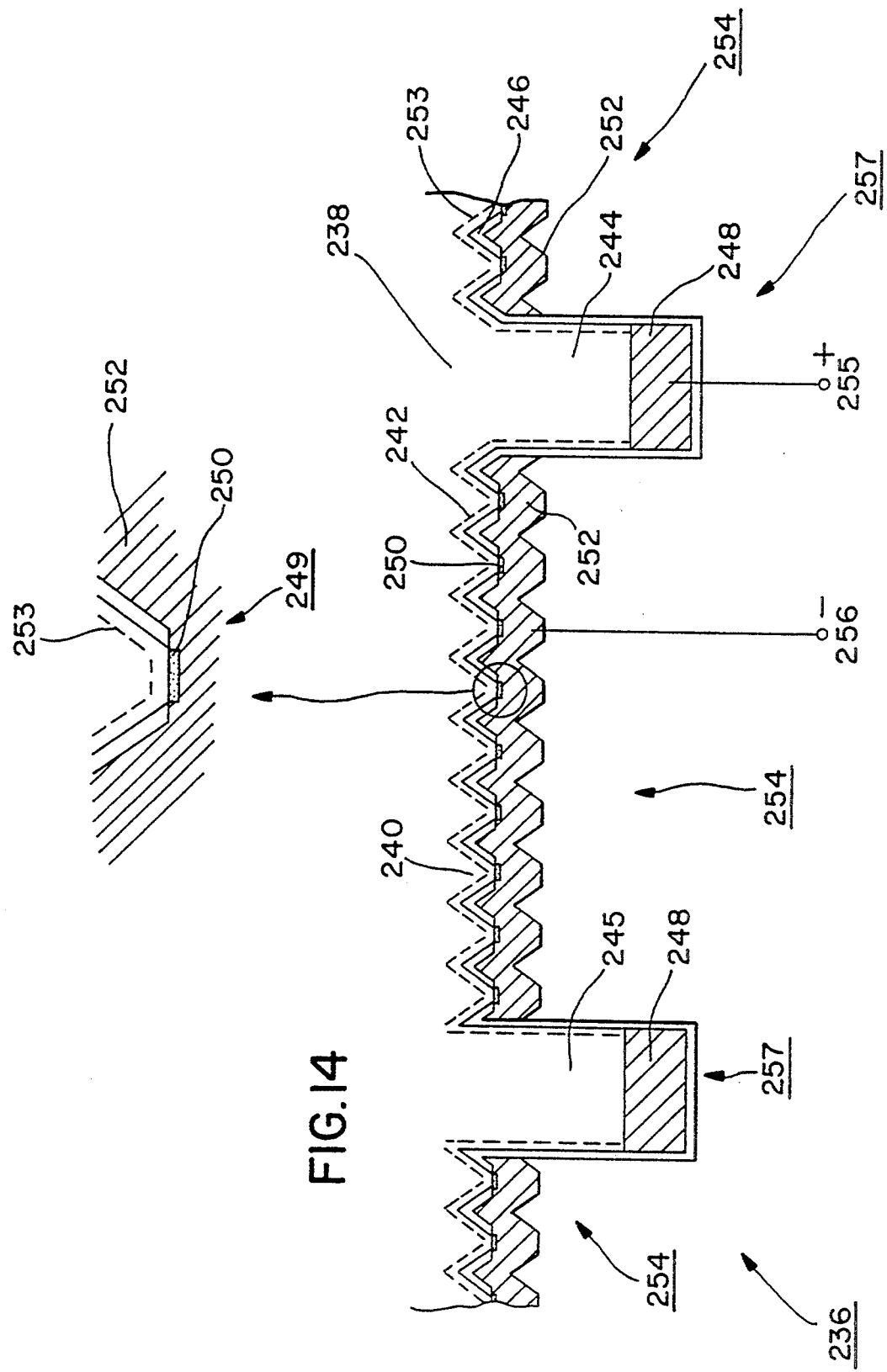
Figure 16:
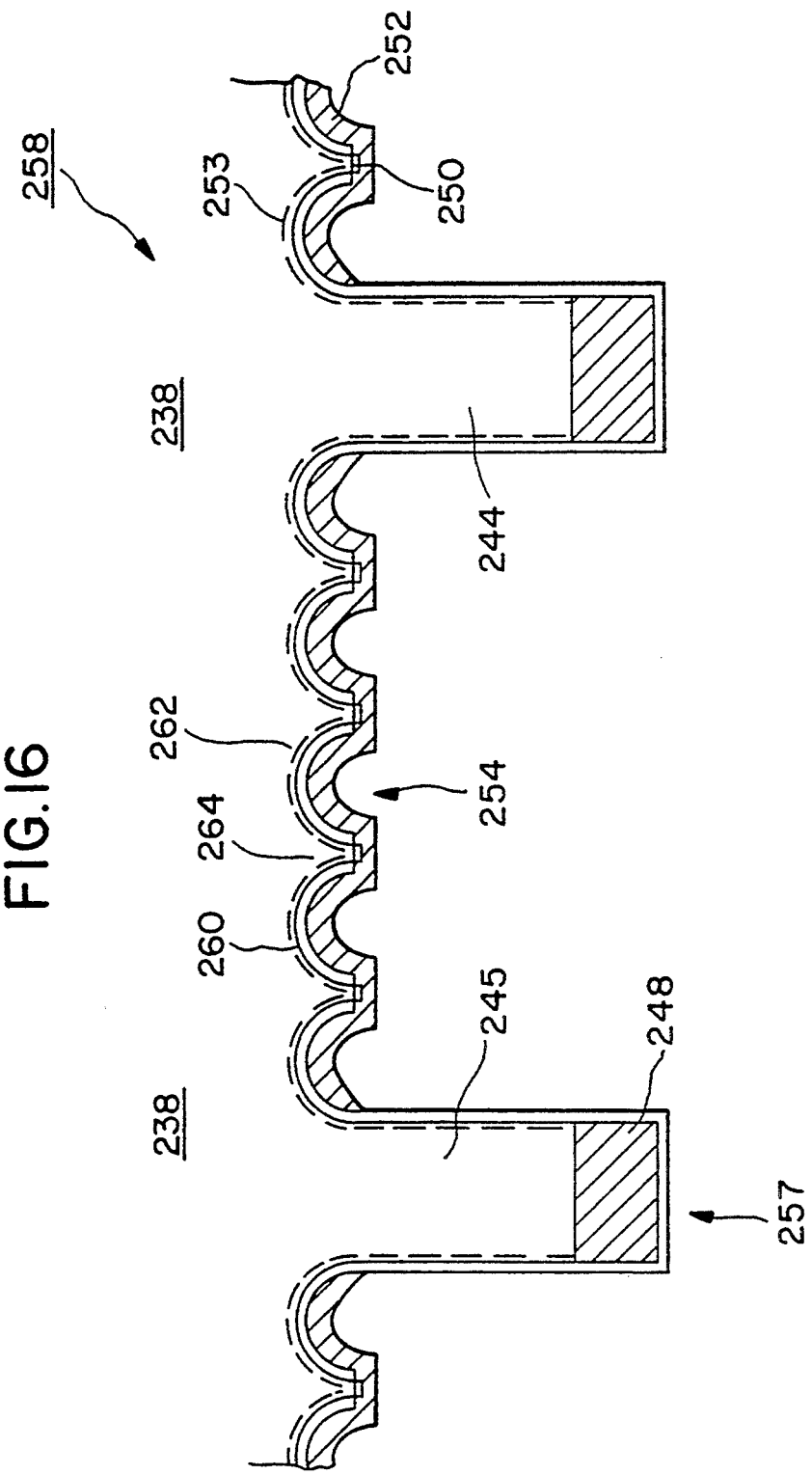

FIG. 6a shows a section through a modified embodiment to the solar cell as per FIG. 5, FIG. 6b shows a detail of the solar cell as per FIG. 6a with additional texturing in the contact area, FIG. 7 shows a back surface of a solar cell for collection of majority carriers, FIG. 8 shows a section through a point contact MIS inversion layer solar cell with textured surface, FIG. 9a shows a section through a further textured point contact solar cell, FIG. 9b shows a detail of the solar cell as per FIG. 9a, FIG. 10a shows a section through a further embodiment of a solar cell, FIG. 10b shows a detail of the solar cell as per FIG. 10a, FIG. 11 shows a structured back surface of a point contact solar cell, FIG. 12 shows a section through a further embodiment of a back surface of a solar cell, FIG. 13 shows a detail of the solar cell as per FIG. 12, FIG. 14 shows a section through a further embodiment of a back surface of a solar cell, FIG. 15 shows a detail of the solar cell as per FIG. 14, FIG. 16 shows a section through a back surface of a solar cell with first and second electrically conducting contacts, and FIG. 17 shows a section through a solar cell with structured carrier substrate.

DETAILED DESCRIPTION OF PREFERRED EMBODIMENTS

The theories in accordance with the invention can, in principle, be applied in any solar cell. In the embodiments, however, only MIS inversion layer solar cells and cells with doped pn-unction are described. The same reference numbers for identical elements are used wherever possible.

FIG. 1a shows a section though the radiation-side front surface of an MIS inversion layer solar cell (10). The cell (10) comprises a semiconductor substrate (12), an inversion layer (14) induced by changes in an insulating layer (and made up of electrons in the case of p-semiconductors), a transparent insulator or passivation layer (16), and a thin tunnel oxide (18) forming together with a metal (20) an MIS contact for collecting minority carriers. An inversion layer formed by the work function difference of metal (20) and semiconductor (12) on the semiconductor surface is provided with the reference number (22). The back of the solar cell (10) can be designed as required, for example from a full-surface or interrupted ohmic contact with passivation of the intermediate area, with a back surface field (BSF), or with raised ohmic contacts (see EP 88105201.3A1), that can be made by local removal of the passivation layer and selective metallization in similar fashion to the front surface as above. To this extent, reference is made to the disclosure: in EP 88105210.3A1.

The manufacture of the solar cell is very simple. After providing a groove structure—raised areas or elevated areas (24), (26), (28) or ridges running parallel to one another and grooved areas (30), (32) such as flutes or trenches between these—on the semiconductor surface, preferably using mechanical means, and after removal of the surface damage, the passivation layer (16) (for example SiO$_2$, CVD SiO$_2$, silicon nitride, or double layer SiO$_2$/Si$_3$N$_4$, preferably plasma-enhanced) is deposited over the full surface. The passivation layer (16), and part of the semiconductor, depending on the required width of the contact area, is removed from the raised areas, preferably by mechanical means., After removal of any damaged semiconductor substrate layer that may have been generated, the thin tunneling insulating layer (18) (1.5 nm thick, for example silicon oxide, oxynitride or silicon nitride) is generated, followed by vacuum angle evaporation of the metal (20). As a result, substantially more metal is deposited on the lateral flank (34), (36), (38) of the raised areas (24), (26), (28) than on the horizontal contact areas proper (40), (42), (44) (this is not shown true to scale in the Fig). The evaporation angle here determines the width of the deposited metal formed into contact fingers.

The metal forming the electrically conducting contacts on the elevated areas (24), (26), and (28) extends accordingly on the one hand in some areas along the flanks (34), (36), and (38) and on the other hand along plateau-like areas (35), (37), and (39). The actual contact areas (40), (42), (44) to the semiconductor material and the ends (17) and (19) of the passivation layer (16) limiting said areas at the sides run inside the plateau-like areas (35), (37) and (39). The width of the plateau-like areas (35), (37) and (39) is accordingly always greater than double the layer width of the passivation layer (16).

The substantially thicker part of the metal layer on the passivation layer (16)—also simply known as the contact—is the real carrier of the current, the resistance of which contact can be made as low as possible by varying its width and thickness without markedly increasing the obscuration.

The horizontal contact area (40), (42), (44) with the semiconductor is, in accordance with the invention, designed very narrow in order to obtain a low reverse saturation current (high no-load voltage!) and low light obscuration, with the width also being adjustable by the removal depth of the semiconductor material from the elevated areas (24), (26), (28). In the ideal case, the contact is linear, i.e. when only passivation material and not semiconductor material is removed.

FIG. 1b shows how the metal layer of the flanks (34), (36), (38) with its very low obscuration also reflects the incident light onto the opposite semiconductor flank and hence ensures excellent entrapment of the light and collection of the charge carriers in addition thanks to the angled light incidence.

FIG. 1b shows clearly that the contact, i.e. the metal layer, covers at least the ends (17), (19) of the passivation layer (16) obtained by removal of the passivation layer material.

The following advantages of the invention must therefore be noted:
  self-adjusting, i.e. mask-free deposition of the contact areas (20) with minimum contact area and light obscuration, but nevertheless high conductivity,
  excellent surface passivation possible regardless of the metal contacts (20), ensuring simultaneously a minimum light reflexion and possible texturing of the semiconductor surface.

As a result, an MIS inversion layer solar cell is obtained with which very high efficiencies can be achieved in a simple manner.

If a structure corresponding to that in FIGS. 1a, 1b is used for collection of majority charge carriers (FIG. 7), the tunnel oxide is dispensed with and the metal is tempered in the case of silicon at temperatures of 350°–500° C. for forming the ohmic contact.

The theory in accordance with the invention can be used to advantage for conventional solar cells with pn-junctions made by diffusion or ion implantation. FIGS. 2a, 2b, 3a and 3b show two embodiments of solar cells (,16) and (48) both containing a highly doped emitter layer (50) in the active area of the solar cell (46) and (48) underneath the passivation layer (16), but-whose contact areas are an MIS contact in the case of FIGS. 2a and 2b, and a doped contact in FIGS. 3a and 3b.

FIGS. 2a and 2b show the semiconductor substrate (12), the highly doped emitter layer (50) made by diffusion or ion implantation (an n+ layer for p-semiconductors, a p+ layer for n-semiconductors), the surface passivation layer (16), the tunnel layer (18) (in the case of silicon preferably about 1.5 nm silicon oxide) for minority charge carriers, and the metal layer (20) for the MIS contact. The number (22) refers to the inversion layer produced underneath the metal (20) as a result of the work function difference of metal and semiconductor. In the case of the p-semiconductor, therefore, the n+ doped layer (50) of the active semiconductor surface area is coupled directly to the electron inversion layer (22) of the MIS contact. The electron transfer to the metal is achieved partly direct from the n+ layer and partly via the inversion layer. Here too, the advantages of angle evaporation and surface passivation are again obtained in a simple manner in accordance with the invention, as described in connection with FIGS. 1a and 1b.

In FIGS. 3a, 3b, the entire semiconductor surface, both in the active and well passivated area and under the metal fingers (20), has a highly doped surface area (50) (n+ layer for p-semiconductors, p+ layer for n-semiconductors), via which the minority charge carriers are supplied to the metal fingers or paths (20). Here, the semiconductor substrate is once again referenced with (12), the highly doped surface layer in the active area with (50), the transparent passivation layer (for example SiO₂, CVD SiO₂, silicon nitride, or double layers) with (16), the highly doped area under the metal finger (20) with (52) and the metal contact fingers obtained by angle evaporation with (20), which fingers have only a very small contact surface in relation to the semiconductor substrate (12) and run predominantly on the passivation layer (16).

The highly doped layer (52) under the metal (20) can in favorable cases (deep pn-junction) be formed by the convergence or overlap of doped areas (54) and (56) in the narrow raised area, or by doping applied in addition after local removal of the passivation layer (16) (by truncating the raised areas (24), (26), (28)).

In one part of the contact area, i.e. underneath the contact finger (20), a very highly doped layer (52) (n++ for p-silicon) generated by double diffusion or ion implantation is obtained that further reduces the reverse saturation current of the solar cell (48) and hence increases the no-load voltage in particular.

On account of the simple-to-achieve low contact spacing and the high conductivity of the doped surface layer (50) and of the contact fingers, the solar cell (48) in particular is also suitable for concentrated light.

The groove structure in the semiconductor material (12), i.e. the trenches or flutes (30), (32) and elevated areas or ridges (24), (26), (28) limiting these, is generated mechanically in accordance with the invention, in particular using wires or sawblades parallel to one another and moved relative to the semiconductor material, or also using a gang saw. This results in dimensions such that the spacing a between adjacent elevated areas (24), (26), (28) is in the range between 30 μm and 2000 μm, and preferably in the range between 50 μm and 300 μm.

The depth t of the trenches or flutes (30) and (32), i.e. the,, distance between the bottom of the trench or flute (30) or (32) and the removed tips of the elevated areas (24), (26) and (28), i.e. the plateau-like area (35), (37) and (39), should preferably be between 25 μ and 200 μm. In particular, the spacing a of the elevated areas (24), (26), and (28) in relation to the depth t of the flutes or trenches (30) and (32) is $10 > a/t > 1.5$.

The previous embodiments (FIGS. 1a, 1b, 2a, 2b, 3a, 3b) are based on the fact that the groove structure shown is produced, as already mentioned, using mechanical processes in the semiconductor substrate (12)

itself. The theory in accordance with the invention and the advantages entailed in the previously explained solar cell front surface structures can however also be applied advantageously for thin semiconductor film type structures (58).

Figure 4:
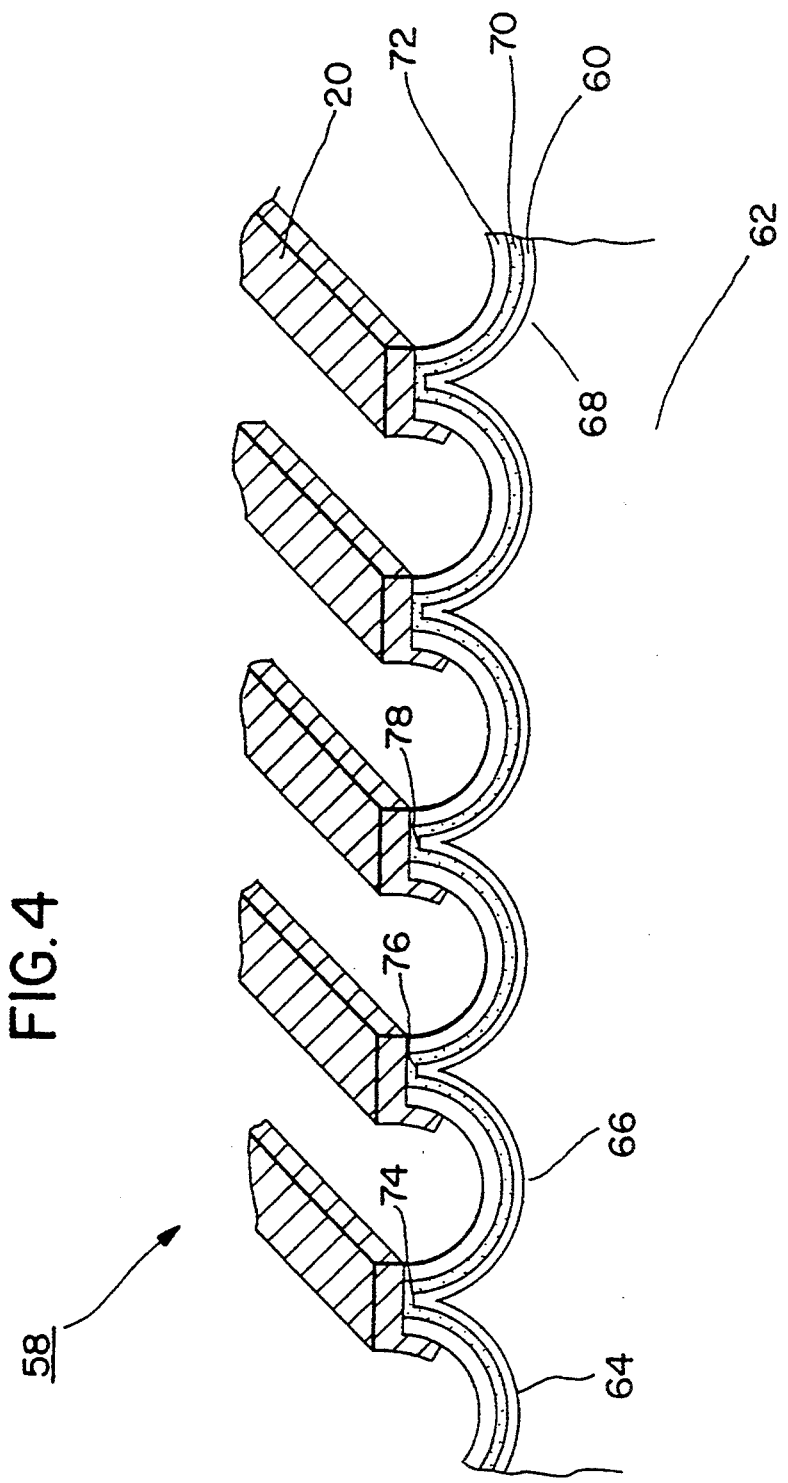
FIG. 4 shows a section through a thin-film solar cell.

As indicated in FIG. 4, a correspondingly doped semiconductor film (60) is deposited on a substrate (62) (for example metal, ceramic, graphite etc.) provided with grooves (64), (66), (68) (with the structure also being achieved using the mechanical process in accordance with the invention). The upper side of the semiconductor film (60) can be highly doped in the form of a layer (70) (for example with p-doping of the semiconductor base layer an n+ layer is generated, thereby forming a homo-pn-junction), or the layer (70) comprises another semiconductor for generation of a hetero-structure. Then a passivation layer (72) is deposited over the full surface and removed locally by truncating the raised areas or elevated areas or ridges (74), (76), (78) between the grooves (64), (66), (68). This is followed advantageously by vacuum angle evaporation of the metallization in the form of metal strips (20) forming a front contact of the solar cell (58) for collection of minority charge carriers. The back surface contact is, for example, provided either by the substrate (62) or by a conductive layer between the substrate (62) and the semiconductor layer (60).

It is thus possible to achieve, for thin semiconductor films too and using the theory in accordance with the invention, very small contact areas with low obscuration and high contact finger conductivity in conjunction with an excellent surface passivation.

In accordance with the embodiments in FIGS. 1 to 2b, the inversion layer principle can be used in addition to that in the sketched example for the case of semiconductor films, with an inversion layer in the active area in conjunction with the MIS contact, or highly doped emitters in the active area in combination with MIS contacts.

A further embodiment of the invention for obtaining with simple technology a small contact area with excellent surface passivation and hence a high efficiency is shown on the basis of the front surfaces of solar cells (80), (82) in FIGS. 5, 6a, and 6b.

In both examples, the semiconductor surface is again characterized by parallel grooves (84), (86) and (88) generated by mechanical means, with metallization for the formation of contact fingers (20) not however being achieved by angle evaporation.

In FIG. 5, the tips of the raised areas (24), (26), (28) provided with passivation layer are only removed in the area of the contact fingers (20) and, for example, metal is deposited through a mechanical mask by vacuum evaporation or cathode sputtering or by screen printing. However, rough adjustment is necessary here.

The embodiments in FIGS. 5, 6a, and 6b are reproduced only for a highly doped emitter layer (50) in the active area and underneath the contacts (20); it is however also possible to apply the inversion layer case (as per FIGS. 1a, 1b) and the combination of highly doped layer in the active area and MIS contact (as in FIGS. 2a, 2b) for these embodiments.

In FIG. 5, (12) represents the semiconductor substrate, (50) the highly doped emitter layer (e.g. n+ layer for p-semiconductor), (16) the transparent passivation layer and (20) the metal finger.

To eliminate the need for adjustment of the metal fingers (20), the passivated raised surface areas (24), (26), (28) of the semiconductor (12) are truncated over their full surface in accordance with FIG. 6, and narrow areas of the semiconductor are thereby exposed. The metal fingers (20) can now be deposited on the semiconductor as required, i.e. without adjustment. However, an additional passivation layer (90) (e.g. plasma-enhanced CVD silicon nitride) must be deposited on the semiconductor areas exposed and not covered with metal at temperatures compatible with the metal.

FIG. 6 shows in diagrammatic form the semiconductor substrate (12), the highly doped emitter layer (50) (e.g. n+ layer for p-semiconductor), the passivation layer (16) (e.g. thermal $SiO_2$, CVD $SiO_2$, silicon nitride, double layers etc.), metallization in the form of fingers (20) and the second passivation layer (90), for which thermal $SiO_2$, which can only be manufactured to the appropriate thickness at high temperatures, is no longer feasible. Plasma-enhanced CVD $SiO_2$, silicon nitride, or aluminum oxide, for example, are suitable here. The double passivation layer comprising the layers (16) and (90) must be optimized as regards passivation and anti-reflection properties by variation of the respective thicknesses and of the process parameters.

The enlarged section in FIG. 6b is intended to show the possibility of texturing the raised horizontal surfaces both in the area of the contacts (20) and in the active area (92) of the solar cell, and hence of achieving extremely small contact surfaces.

The proposal characterizing the invention to make possible in simple manner an optimum surface passivation of the semiconductor before the contacts are made, and to permit very small contact areas with self-adjusting contact generation, can be used not only for the collection of minority charge carriers (preferably on the front surface), but also for the collection of majority charge carriers preferably on the back surface of the solar cell.

FIG. 7 is only an example of a solar cell (94) having a structured back surface (96) with ohmic strip contacts, i.e. local metallization and local back surface field. A semiconductor element (12), which in the example is p-doped silicon, is provided with a surface passivation layer (98) (e.g. $SiO_2$, silicon nitride, silicon oxynitride, aluminum oxide, double layers etc.). In addition, strip-like metal contacts (100), (102) are provided, which in the example are deposited by vacuum angle evaporation and tempered at a temperature suitable for achieving an ohmic contact. The number (104) refers to a highly doped layer achieved by diffusion, ion implantation, or alloying (p+ silicon in the example), so that a local pp+-junction (back surface field) is available for repelling the minority charge carriers. The passivation layer (98) doubles as a mask, in accordance with the concept of the invention. However, application of the doped area (104) can also be dispensed with entirely.

The solar cell according to FIG. 7 is particularly suitable for two-sided light-sensitive (bifacial) solar cells in order to exploit with particular efficiency the incident light from the back.

The metal layer (100) can be deposited locally—as explained in connection with FIGS. 1a–4—but also in self-adjusting manner using other methods (e.g. currentless metallization, immersion, spin-on methods). Full-surface metallization of the back surface (96) is possible, thereby providing in addition—since the metal is largely on the passivation layer (98)—an excellent optical back surface mirror with a small contact surface.

When an n-doped semiconductor material (12) is used in FIG. 7, the layer (104) represents a strongly n-doped (n+) area, such that an nn+-junction is present. The grooves or flutes (106) covered by the passivation layer (98) can in their turn have any shape (angular, rounded corners etc.). Here too, generation of the grooves (106) using a wire saw or gang saw is at the forefront. The groove depth and spacing can vary within wide limits. The combination of the solar cell back surface (96) provided with grooves (106), as shown in FIG. 7, with the similarly structured front surface configurations shown in FIGS. 1a to 6b is advantageous particularly when the grooved areas on the front surface are vertical to those on the back.

Application of the theory in accordance with the invention for textured solar cells, i.e. cells with preferably pyramidal or tapered projections in order to provide point contact solar cells, is explained on the basis of FIGS. 8 to 11.

The invention for generation of point contacts is described here using the example of an ohmic contact, an MIS contact, and a doped contact.

Pyramids projecting from a surface of a silicon semiconductor substrate first have a passivation layer (e.g. thermal $SiO_2$, CVD $Si_3N_4$ etc. formed thereon). The silicon is exposed by removal of the pyramid tips and then covered with metal, and, in the case of the ohmic contact, subjected in addition to a tempering process between 400° C. and 500° C. Square point contacts are thereby obtained on the truncated pyramids. The side faces or flanks are passivated.

In the case of the MIS contact, a thin tunnel oxide layer is allowed to grow after removal of the pyramid tip. The metal layer is then deposited. The method can also be used to advantage in order to generate locally diffused or ion implanted areas for point contacts, for example, since the passivation layer doubles as a mask and hence permits selective and self-adjusting doping of these areas. If the semiconductor is p-doped silicon, a point contact (n+p) collecting minority carriers can be generated by n+ doping (e.g. phosphorus), and a contact (pp+) collecting majority carriers by p+ doping. The same applies for the use of n-doped silicon (p+n and n+n).

The theory in accordance with the invention of truncated pyramids can be used to advantage initially for conventional solar cells collecting minority carriers on the front surface and majority carriers on the back surface. In any case, optimum passivation of the semiconductor surface, very small contact surfaces of metal and semiconductor, and hence high efficiencies are achieved simply, as in the cell types already described.

For this purpose, the pyramids must be selectively truncated at the places to be provided with contacts, for example in the form of a finger structure, using suitable methods, preferably mechanical grinding, milling, or lapping, in order to remove the passivation layer locally. Finally, the metal fingers must be provided. This can be achieved by, for example, evaporation or sputtering using an adjustable mechanical mask or by screen printing.

For application of the method to the MIS inversion layer solar cell, on whose front surface an MIS contact grid is located and whose active surface between the metal contacts such as contact fingers is covered with a transparent insulating layer containing charges at the boundary area to the semiconductor, the truncated pyramids must be provided in the contact area with a tunnel oxide layer approx. 1 nm–2 nm thick. The pyramids are therefore truncated only at those points on which the metal fingers are provided, i.e. similarly to the groove structure shown in FIG. 5. The area between the contacts is completely covered with the passivation layer.

In the case described above, it is however necessary to deposit the metal precisely on the intended contact areas consisting of truncated pyramids. Adjustment is therefore necessary here. To eliminate the need for this adjustment, a structure as indicated in FIG. 8 can be applied for the front surface of the solar cell.

A solar cell (108) shown in FIG. 8 comprises among other things a semiconductor substrate (110), a thin tunnel oxide layer (112) and a metal layer (114) for an MIS tunnel contact, a passivation layer (120) (e.g. thermal $SiO_2$, CVD $Si_3N_4$ or double layer) applied at high temperatures before truncating of the pyramids (116), (118) and before application of the metal layer (114), and a passivation insulating layer (122) applied after metallization. A second thin passivation layer, preferably silicon oxide, can be provided in the area of the pyramids or later truncated pyramids (116), (118) between the semiconductor (110) and the passivation layer (122).

The procedure is as follows:

After passivation of the entire front surface of the solar cell (108), the pyramids (116), (118) are truncated and hence the passivation layer (120) removed locally. Then the tunnel oxide (112) of 1 nm to 2 nm thickness is generated on the exposed semiconductor areas and the metal grid (114) deposited at any point. Finally, the structure thereby obtained is covered with the passivation layer (122) preferably deposited from the gas phase at temperatures up to 350° C., in order to passivate in particular those semiconductor areas (truncated pyramids (116) remaining and previously exposed between the metal layer, i.e. the contact fingers (114), and to generate at these points an inversion layer using the incorporated insulator charges. Plasma silicon nitride in conjunction with cesium doping is well suited to this purpose. The greater part of the surface, i.e. the sides of the truncated pyramids (116), are covered with the excellent passivation layer (120) initially deposited.

An application of the method in accordance with the invention to a conventional, diffused or ion-implanted solar cell proves to be most advantageous. Three possibilities are highlighted here.

a) Combination of the doped active areas with MIS contacts (see FIGS. 9a, 9b).

A solar cell (124) shown in FIG. 9 purely in principle as a section (without back contact) comprises a semiconductor substrate (126), a tunnel oxide (128), a metal layer for the MIS contact (130), a surface layer (132) highly doped predominantly by diffusion or ion implantation (emitter, n+ in p-substrate and p+ in n-substrate) and a passivation layer (134) (e.g. thermal $SiO_2$, CVD $SiO_2$, CVD $Si_3N_4$, double layer). A pn-junction is generated, for example by diffusion or ion implantation (e.g. n+ area on p-substrate) over the full surface underneath the textured elevated areas (136), (138) having pyramidal or other geometries and the passivated semiconductor surface. In the contact area, the passivation layer (134) is locally removed by truncating the pyramids (136), (138), and the point contact positions (140), (142) thereby obtained are provided with the approx. 1 nm to 2 nm thick tunnel oxide layer (128). This is followed by local application of the metal layer (130), preferably by vapor deposition of aluminum in the case of p-silicon. The n+ layer is linked directly to the inversion layer underneath the metal (130). In addition, a passivation layer—as per FIG. 8—can be deposited over the entire surface including metal fingers (130). Here too, the pyramids can be truncated over the entire front surface and a passivation layer can be re-applied over the full surface at temperatures compatible with the metal layer after the metallization process.

b) Double diffusion in the area of the contacts (see FIGS. 10a, 10b).

By truncating the pyramids (136), (138), the doped area is also largely eliminated in the diffused or ion implanted solar cell (124) as per FIGS. 9a and 9b, and hence the pn-junction is removed locally in the contact area. In the case of normal contacts (not as shown in FIGS. 9a, 9b), with a metal of low work function in order to achieve depletion or inversion in the p-semiconductor and alloying at higher temperatures, a short-circuit to the substrate (126) would then result.

With the embodiment as per FIGS. 10a and 10b, this should be avoided.

A solar cell (144) shown in diagrammatic form and as a section has a structured semiconductor substrate (146) with point-like elevated areas such as pyramids (148), (150). The semiconductor substrate (146) has an initially generated doped surface layer (152) (emitter n+ in p-substrate and p+ in n-substrate), a highly doped layer (154) generated only in the contact area after truncating of the pyramids (148), (150), a contact metal (156), and a passivation layer (158).

The highly doped area (154) is generated preferably by diffusion or ion implantation at the contact point, with the passivation layer (158) being used as the mask. Then, as is usual in conventional silicon solar cell technology, the metal (156) with the required properties is deposited and an ohmic contact with low transition resistance is generated with the doped area (154). As a result of the doped areas (152) on the sides of the truncated pyramids (150), the partially very heavily doped areas (154) (n++) are generated by double diffusion, as a result of which the reverse saturation current of these contacts is very low and hence the achievable no-load voltages and fill factors very high. The contact surface, which is very small in accordance with the invention, contributes substantially to a low reverse saturation current. Similarly to the example of the MIS inversion layer solar cell according to FIG. 8, the diffused or ion-implanted solar cell (144) can also be manufactured without the need for adjustment of the metal grid (156), namely by full-surface removal of the pyramid tips and subsequent full-surface second diffusion or ion implantation with the highly doped areas (154) being produced over the entire solar cell surface. Like layer (122) in FIG. 8, it is advantageous here too to deposit a second passivation layer onto the entire solar cell surface, without however impairing the contacts (156).

c) With only a low removal depth of the pyramids and possibly lower pn-junctions, it is however possible, thanks to the overlap of the doped areas (see for example FIG. 6b and FIGS. 9a, 9b, 10a, 10b) in the upper parts of the pyramids, to achieve heavy doping in the truncated contact area, so that double diffusion is no longer necessary and hence the process is simplified. The overlap results in an advantageous increase in the doping.

A further very advantageous application of the theory in accordance with the invention for generation of raised areas and local removal of the passivation layer—preferably using mechanical methods—results from a combination of the groove structures as shown in FIGS. 1 to 6 with the point contact arrays in the form of truncated pyramids as shown in FIGS. 8 to 10. With these, extremely small contact areas can be achieved simply, and hence extremely low reverse saturation currents together with excellent surface passivation.

As is made clear by FIG. 6b, substantial advantages result from the texturing of the raised areas provided between the grooves. On the one hand, those areas not covered by the optimally acting passivation layer (16) in the active area of the solar cell are very small, since these areas are of the point type. This reduces recombination of charge carriers. On the other hand, the contact area proper between the metal and the semiconductor is considerably reduced by the point contacts in the area covered by the electrically conducting contacts for conducting the charge carriers. The greater part of the semiconductor or the highly doped layer is, as already mentioned, covered by the optimized passivation layer (16). These advantages of texturing can be achieved for all the embodiments shown in FIGS. 1 to 7, with the case of the inversion layer solar cell according to FIGS. 1a and 1b being particularly noteworthy.

Raised point contacts can be generated in accordance with the invention in other ways. Based on the groove structures shown in FIGS. 1 to 7 and generated by, for example, wire sawing, it is possible to generate, by similar sawing using parallel wires at defined spacings from one another and as closely as possible at right angles to the initial grooves, a regular system of columns that widen towards their bases. The cross-sections of these columns and hence the form of the point contacts can be rectangular, square, or rhomboidal, depending on the sawing angle. Any variation required in the point contact surface can be achieved by appropriate selection of the wiring spacings.

The back surface of the cells in the above arrays for collection of majority charge carriers can be designed with many variants. It can for example be textured or untextured, covered with metal over its full surface or in strips, with the intermediate area being covered with a passivation layer in the latter case. Truncating of the pyramids in the contact area in accordance with the inventive concept, over the full surface or in strips, is also possible to reduce the ohmic contact proportion.

Like the structure shown in FIG. 7 for collecting the majority charge carriers preferably on the back surface of the solar cell, the truncated pyramids provided in accordance with the invention can be used advantageously as point contacts with a local back surface field for majority carrier collection.

An example for a solar cell back surface structured in this manner is shown in FIG. 11. A semiconductor substrate (160) has a passivation layer (162) (single or double layer, thermal $SiO_2$, silicon nitride etc.), a contact metal layer (164) and a highly doped zone (170) (representing a p+ layer when a p-semiconductor is used) in the plateau of the structure formed by pyramids (168), cones, columns, etc. so that in the truncated area of the pyramid (168), there is a $pp^+$-junction for repelling the minority charge carriers. The metal layer (164) is tempered at suitably higher temperatures so that it forms a good ohmic point contact with the semiconductor or with the highly doped layer (170). The layer (170) can however also be dispensed with. The metal (164) can be deposited over the full surface, so that it runs for the most part on the pyramid flanks provided with the passivation layer (162) and hence forms an excellent back surface mirror.

The metal (164) can however also be applied in strip form, similarly to what is shown in FIGS. 8 to 10, where the semiconductor areas between the strips can be covered preferably with a second passivation layer. This permits exploitation of the incident light from the back.

The second passivation layer is, as shown in the embodiment in FIG. 8, necessary in particular when the pyramids (168) are truncated over the entire back surface and hence the semiconductor is locally freed of the passivation layer. Like the contacts of the front surface for collecting minority carriers as in FIG. 9, the pyramids (168) can also be truncated and highly doped only in the area of the metal contact strips, whereas in the area between the strips the completely passivated pyramids (168) are retained.

FIGS. 12 to 15 show, on the basis of examples, a number of variants for a contact array (contacts for collecting minority and majority charge carriers) disposed on one surface of a solar cell. This configuration should preferably be used for the back surface of solar cells, have small contact surfaces, and be well passivated. The front surface should not have any contacts and only be provided with an excellent passivation layer (antireflection layer) or with an additional contact system collecting minority charge carriers.

In the forefront is a structure with interlocking MIS and ohmic contacts in conjunction with an inversion layer in the semiconductor.

A solar cell (210) shown in FIGS. 12 and 13 comprises a semiconductor substrate (212) (in this case preferably p-conducting silicon), and a thin insulating layer (214), which must be tunnelled through by the electrons. The insulating layer (214) forms, together with metal strips (216) an MIS contact (230) (metal (216)-insulator (214)-silicon (212))for collecting the minority charge carriers.

Wider metal strips (218) form ohmic contacts for collecting the majority charge carriers. The semiconductor substrate surface is structured and has in the embodiment pyramidal elevated areas (220), (222), (224). A different geometry using cones or columns is also possible. The elevated areas such as pyramids (220) (222), (224) are covered with a transparent insulating layer (226) that contains positive changes at its boundary area to the semiconductor (in the event that p-silicon is used). After removal of the pyramid tips and hence of the passivation layer and if necessary of semiconductor material, contacting with the metal can take place.

The array accordingly comprises ohmic contacts (218) at a distance from one another (for majority charge carrier collection, e.g. aluminum on silicon), between which several narrow MIS contacts (230) (for minority charge carrier collection, e.g. aluminum 1.4 nm silicon oxide p-silicon) are located with narrower spacing. The respective contacts can be preferably points or lines, with several points together being able to form a single ohmic contact.

A well-conducting inversion layer (228) is induced on the semiconductor surface because of the positive insulator charges. Underneath the MIS contact (230) in the silicon (212) is also an inversion layer, resulting from the work function difference of metal and semiconductor.

The mode of operation for collecting minority charge carriers with this array is as follows:

The minority charge carriers (in this case electrons) generated by the incident light from the front or back diffuse out of the interior of the semiconductor to the inversion layer (228) and pass horizontally along this layer to the MIS tunnel contacts (230), through which they leave the semiconductor and enter an external circuit (negative pole (234)). The majority charge carriers (in this case holes) are repelled from the MIS contacts (230) by the electrical field prevailing on the surface in the area between the ohmic contacts (218), collected by these ohmic contacts (218), and passed to an external circuit (positive pole (232)). Separate collection of minority and majority charge carriers therefore takes place, as is necessary for a solar cell to operate. In the present instance, both charge carrier types are collected on one surface only, preferably on the back surface of the solar cell (210).

The two contact systems can, for example, be achieved in the form of interlocking grids, concentric ring systems or,point-type contacts.

The new configuration differs from all the known arrays not only in the presence of truncated passivated pyramids (220), (222), (224) but also in that the minority charge carriers must flow along the thin inversion layer (228) in the horizontal direction to the MIS contacts (230). For that reason, this array is particularly suitable for large-area terrestrial applications, and less so for high currents resulting from strong light concentration.

The surface of the MIS contacts (230) in accordance with the invention should be as small as possible for three reasons:
a) Achievement of a low reverse saturation current and hence a high no-load voltage of the solar cell (210) (coverage less than 20% if possible);
b) Exploitation of the radiation incidence on the cell (210) from the back for generating charge carriers;
c) Enabling long-wave radiation to escape through the back surface of the solar cell (210), as a result of which heating of the solar cell (210) is reduced and hence a higher operating voltage achieved.

The transparent insulating layer (226), preferably thermal silicon oxide, plasma silicon nitride, etc. can be manufactured and/or tempered at any temperatures in order to achieve optimum passivation.

It is of advantage that high densities of positive charges are present in the insulating layer (226), which in the ease of plasma silicon nitride is achieved simply by the incorporation of preferably alkali ions.

In the solar cell (210) shown in FIG. 12, the pyramid tips of the entire back surface can also be removed (i.e. not only in the contact area). This requires however the deposition of an additional passivation layer over the entire back surface of the cell in order to passivate the pyramid surfaces not covered with metal.

According to current knowledge, however, a fundamental problem occurs in the solar cell (210) shown in FIG. 12, unlike in the IBC solar cell described at the outset, which can lead to a drastic lowering of solar cell efficiency: the two poles (232), (234), MIS contacts (230) and ohmic contacts (218), between which the photoelectric voltage is to build up, are connected internally by the highly conductive inversion layer (238), corresponding to a low parallel resistance (shunt) and hence practically to a short-circuit. A large proportion of the charge carriers would therefore flow, not via the external circuit, but via the very highly conductive inversion layer (228) on the semiconductor surface from one pole to the other, resulting not only in a reduced no-load voltage but also in particular in a greatly reduced fill factor of the solar cell (210) (low parallel resistance). One possible remedy could be the use of various more or less complicated methods such as local interruption of the inversion layer, incorporation of an accumulation layer, or local increase of the resistance of the inversion layer.

Surprisingly, however, measures of this type are not necessary at all in a solar cell with the back surface structure in accordance with the invention and having interlocking or otherwise adjacently disposed ohmic contacts (218) and MIS contacts (230); indeed, the following arrangement alone is sufficient:

1. The spacing between the MIS contact (230) and the ohmic contact (218) is as small as possible (about half the distance between the MIS contacts (230) themselves).
2. The remaining semiconductor surface, preferably p-silicon, between MIS contact (230) and ohmic contact (218) is, like the areas between the MIS contacts (230), covered with the transparent insulator layer (226), preferably plasma silicon nitride, which contains at the boundary surface to the semiconductor substrate (212) as high as possible a positive charge density (for example by incorporation of cesium), in order to generate a highly conducting inversion layer (228) in the semiconductor substrate (212).

Contrary to previous opinion, as many as possible of the minority charge carriers are moved by this arrangement away from the ohmic contact (218) along the inversion layer (228) to the MIS contacts (230). Conduction of electrons out of the inversion channel (228) to the ohmic contacts (218) and hence a lowering of the parallel resistance does not occur, contrary to expectations and even without additional measures. The closer the MIS contact (230) approaches the ohmic contact (218), the higher the short-circuit current and fill factor and hence the efficiency of the solar cell.

Provided the contacts are in strip form, the spacings of the MIS contact fingers from one another should be about 10–30 times greater than the width of the contacts themselves. In the case of the ohmic contacts, which are wider than the MIS contacts, a similar ratio should prevail. The obscuration by the ohmic and MIS contacts (218) and (230) respectively is 5%–10% in each case.

To achieve the narrow spacings between the ohmic contacts (218) and the MIS contacts (230), exact adjustment of the two metal grid structures in relation to one another is necessary. This can be achieved in conventional manner, for example by photolithography and etching of the metal layers, or by applying the metal through mechanical masks provided with adjustment marks. Selective application of the metal by screen printing is also possible here.

The solar cell back surface (210) shown in FIG. 12 can of course also be advantageously designed for doped point contacts, in analogy to the IBC or PC solar cell, with the passivation layer on the truncated pyramids being suitable as an ideal self-adjusting doping mask. In the case of p-silicon, n+point contacts (collecting minority carriers) are provided next to p+ point contacts (collecting majority carriers) on the truncated pyramids, with the intermediate area being covered with a passivation layer.

A proposal that is inventive per se provides for avoidance of the adjustment operations previously mentioned and less suitable for a mass production process by a simple self-adjusting process incorporating the truncated pyramids.

As described in European Patent Application EP 88105210.3 A1, a semiconductor such as a silicon back surface can be removed using various methods to produce a structure such that at certain distances (in the millimeter range) raised areas remain on which are disposed ohmic contacts for collection of majority charge carriers. In the area between these ohmic contacts, designated as contact ridges, contacts collecting minority charge carriers are disposed, either in the form of an MIS finger structure (similar to FIG. 12) on the truncated and passivated pyramids, or as a full-surface metal/insulator/silicon area as shown in FIG. 14.

FIGS. 14 and 15 show sections of a back surface of a solar cell (236) having a semiconductor such as a silicon substrate (238) with pyramidal elevated areas (240), (242). Before formation of the elevated areas (240), (242), ridge-like projections (244), (245) were formed from the semiconductor substrate. Metal (248) for formation of the ohmic contacts (257) was then deposited onto these projections (244), (245). The entire semiconductor substrate surface is then covered with a passivation layer (246). Finally, the tips of the pyramids or similar elevated areas (240), (242), i.e. the passivation layer and if necessary areas of the semiconductor material, are removed in order to provide a thin insulator layer (250) on the exposed semiconductor substrate. The area between the ohmic contacts (257) is then covered with metal (252). The metal (252) acts, corresponding to the surface extension of the insulating layer (250) and together with the exposed semiconductor underneath it, as the the metal of MIS contacts (254). An inversion layer (253) is induced on the semiconductor surface.

In other words, metal (252), insulating layer (250) and semiconductor substrate form in some areas an MIS contact (254).

The raised ohmic contact (257) itself can be flat over its surface or—like the intermediate area—can comprise truncated pyramids or other elevated areas. The metal for the raised contacts (257) can, before the generation of the raised semiconductor areas, i.e. of elevated areas (244), (245), be deposited over the full surface or subsequently, preferably self-adjusting, by vacuum angle evaporation. In the latter case, evaporation takes place at a very shallow angle, so that the one flank of the raised semiconductor area is covered with a large amount of metal, and the surface area with considerably less. The metal can also be deposited with the aid of a mechanical mask onto the raised areas.

Metallization (248) of the raised areas (244), (245) can also take place only after deposition of the passivation layer (245) and after local removal of the same from the upper surfaces of the areas (244) and (245). In this case, the metal covets the passivation layer (246) at least in some areas.

To obtain by simple means a defined minimum distance from the ohmic contact (257) to the MIS contact (254) without the risk of a local short-circuit, the metal for the MIS contact (254) is, in accordance with the invention, evaporated largely vertically in a vacuum deposition facility after completion of the ohmic contacts (257). Uniform coating is achieved both of the lower-lying MIS contact area and of the raised ohmic contacts (248), while little or no metal is deposited on the vertical or slightly inclined flanks. A metal etching process ensures that the flanks of the raised contact areas (244) are free of metal and that hence exact separation of the ohmic contacts (257) and MIS contacts (254) is achieved without special adjustment.

The MIS contact referenced as (254) and provided between the ohmic contacts (257) is an MIS contact area in the actual sense, and is composed of individual MIS contacts (249), which however are conductively connected to one another by the metal layer (252) and which form the negative pole (256).

For reasons of simplicity, the MIS contact area extending between the ohmic contacts (257) is designated as the MIS contact (254).

The spatial distance of the contacts (257) and (254) is determined by the height and shape of the raised areas. Wet-chemical etching, plasma etching, mechanical removal, or other methods can be used to adjust the height and shape as required. The areas can be limited by inclined flanks, as achieved by wet-chemical anisotropic etching, for example, or by vertical, rounded, or otherwise shaped side walls. Apart from the mechanical support function, thanks to which the semiconductor can be made very thin without problems (important for back-collecting solar cells!), the object of the raised areas in FIG. 14 differs considerably from that of the array as shown in EP 88105201.2 A1. This included the requirement that the height of the areas plus the thickness of the semiconductor substrate must be of the same order of size as the diffusion length of the minority charge carriers, so that the latter can no longer reach the ohmic contact. In the present instance, however, this condition is of lesser importance, since the directly adjacent inversion layer (253) and the MIS contacts (254) in practice lead to the minority carriers being extracted to the side before they enter the raised contact area (257), and made available for exploitation via the MIS contact (254). Those minority carriers that do reach the raised areas (244), (245) are then passed by the inversion layer along the flanks to the MIS contacts (254). Thanks to this lateral extraction of the minority carriers on both sides, the contact (257) collecting the majority carriers is completely shielded against being reached by minority carriers when the raised areas (244), (245) have a suitable geometry (advantageous: width less than twice the diffusion length).

This back surface array generated by simple means therefore exceeds the conventional back surface field in its effect of repelling the minority carriers. To reduce the ohmic contact resistance, an alloying or diffusion process can be applied in addition on the raised area prior to or in conjunction with metal deposition (e.g. pp+) as a result of which a getter process also takes place to improve the service life of the minority carriers.

The requirement set forth in EP 88105210.3 A1 to select the spacings of the ohmic contacts from one another larger than twice the diffusion length is also no longer applicable in the array in accordance with the invention. The ohmic contact areas (257) can be lined up as close together as necessary, since the minority carriers can no longer reach the actual ohmic metal semiconductor contact (257) at all because of the extraction by the inversion layer (253) next to the space charge zone even when the spacings are very narrow.

The function of the solar cell (236) with contacts on one surface is based in accordance with the invention on the fact that no electron transfer, i.e. no internal short-circuit (shunt) takes place through the inversion layer (253) connecting the two terminals (MIS contact (254), ohmic contact (257)) in FIG. 14. To minimize the series resistance and recombination, the ohmic contact areas should not be made too wide (width$\approx$100 $\mu$m) nor their spacings too wide. For example, with a diffusion length of 150 $\mu$m$\approx$200 $\mu$m, a contact width of 100 $\mu$m, and a contact height of 80 $\mu$m, the ohmic contact (257) is probably completely shielded from minority carriers.

As regards the design of the solar cell front surface for the back surface structures shown in FIGS. 12 to 15, there are several possibilities depending on which solar cell type is required:

1) Solar cell with back surface collection of charge carriers and the possibility of light exploitation on both surfaces:
   In this array, the structure as shown in FIG. 12 can be used for the back surface with interrupted MIS contacts when light exploitation on both surfaces is required.
   With the structure shown in FIG. 13, an efficient single-surface solar cell is obtained thanks to the optical reflector on the back surface. The front surface contains no contacts and hence no light obscuration, since both holes and electrons are collected on the back surface.
   It is extremely important that the front surface has a very low surface recombination speed, i.e. that the charge carriers generated in its vicinity by the light do not recombine at this surface. For this purpose, a pp+-junction can be generated on the front surface similarly to the already mentioned front surface field (FSF) solar cell underneath the reflection layer, said junction preventing the minority charge carriers from reaching the surface by its potential barrier. It is however also possible, as in the case of the tandem junction solar cell, to generate a surface pn-junction repelling majority charge carriers. Generating a pn-junction or pp+-junction involves complex high-temperature processes. Furthermore, an antireflection layer must be deposited in addition. To fulfill the low-temperature requirement and to achieve a simple and inexpensive manufacturing process, surface passivation and antireflexion layer are provided in a single process step. To do so, an insulator layer containing hydrogen and having the appropriate thickness is deposited on the natural or intentionally thermally generated oxide on the front surface of the solar cell, as a result of which both the surface states are saturated and the reflexion at the semiconductor surface reduced. Insulator charges are of advantage here, so that the silicon surface is either enriched or is undergoing inversion. Silicon nitride is very well suited, and is deposited preferably in glow discharge at temperatures between 350° C. and 600° C. (manufacturing or after-treatment temperature) and, for example, by reaction of the hydrogen-containing components silane (SiH$_4$) and ammonia (NH$_3$).
   With a refractive index variable within wide limits. (between 1.8 and 2.6), minimal reflection can be achieved for each array, while providing perfect protection of the surface against the penetration of impurities.

A layer of this type has already been used in DE 35 36 299 A1 for reducing the surface recombination speed. Other thin insulating layers, suitable both for passivation and for reflection reduction and advantageously containing positive or negative charges, and thermal silicon oxide are also feasible. The surface should preferably be textured.

In the solar cell in accordance with the invention, the light hits the semiconductor, without any obscuration by the surface, and generates inside, but relatively close to the surface, electron/hole pairs. Both charge carrier types must now diffuse to the back surface, with the minority charge carriers being collected by the MIS contacts (254) and the majority charge carriers by the ohmic contacts (257), and used to provide work output via an external circuit (positive pole (255), negative pole (256)) (FIG. 14).

The thickness of the semiconductor substrate (238) should be lower than the diffusion length of the minority charge carriers, so that as many as possible of these charge carriers can reach the back surface without recombination. The minority charge carriers pass to the MIS contacts (254) both directly and via the inversion layer (253). The incident light from the back can also be exploited very well, since the charge carriers generated close to the back surface by the incident light from the back are optimally collected.

2) Solar cell with collection of minority charge carriers on both surfaces:

If contact ridges are applied to the front surface of the solar cell shown in addition to the two contact arrays on the back surface (FIGS. 12 to 15), and are able to collect the minority charge carriers, the behavior of the solar cell changes drastically. The result is crucial advantages both when the front surface only is irradiated and when both surfaces are irradiated.

If light only reaches the cell from the front, the result of collection of the minority charge carriers on both surfaces, with the same thickness and quality (diffusion length) of the semiconductor material, is a higher collection efficiency than with the normal BSF (back surface field) solar cell. The degree of improvement depends on the ratio of cell thickness to diffusion length. It is therefore also possible to use less expensive semiconductor materials (shorter diffusion length) and yet achieve high efficiencies. The configuration described here is advantageous in particular for the case in which both the thickness of the semiconductor material and its diffusion length are reduced for cost reasons.

If the cell receives light with equal intensity from both sides, almost twice the work output is obtained regardless of the diffusion length, since the efficiency for front and back surface light incidence is identical, apart from the higher obscuration on the back surface. In this respect, this cell differs substantially froth the cell described in 1) that collects minority carriers on one surface, in which the ratio of front surface efficiency to back surface efficiency depends very heavily on the diffusion length. In the case of diffusion lengths lower than the thickness of the substrate, the result is a very poor front surface efficiency.

The back surface arrays in accordance with the invention now permit the double-surface solar cell to be achieved, preferably together with the front surface structure applied in the MIS invention layer solar cell, using simple low-temperature processes.

The mode of operation of this solar cell collecting minority carriers on both surfaces is as follows:

The light incidence from both the front surface: and the back surface into the p-semiconductor element generates electron/hole pairs. The holes travel to the ohmic contacts on the back surface and are collected by the latter. The electrons as minority charge carriers now diffuse, depending on where they are generated, either to the front surface or to the back surface, and reach the MIS contacts. The contact systems of the front and back surfaces collecting the minority carriers should preferably be externally connected to one another and form the one pole of the solar cell. The back surface contact system collecting the majority charge carriers forms the other pole. This corresponds to a parallel connection of the two MIS diode arrays of the front and back surfaces.

The double-surface collection of minority carriers now permits:

a) the achievement of higher efficiencies with front surface irradiation by increasing the spectral sensitivity in the long-wave range, b) the use of a substantially lower diffusion length and hence of a less expensive semiconductor material with the same semiconductor substrate thickness, or with the same diffusion length a higher thickness of the semiconductor can be selected and hence more light absorbed.

c) substantially better exploitation—in addition to the increased efficiency with front surface irradiation and in contrast to previously known solar cells with irradiation from two sides—of the light from the rear also, apart from the additional obscuration by the MIS contacts, since the minority charge carriers do not have to diffuse first through the entire semiconductor substrate to the collecting contacts on the front surface (the obscuration by the MIS contacts on the back surface of the solar cell should not greatly exceed 10%, so that the total obscuration of the back surface by ohmic and MIS contacts stops at about 20%), d) achievement of a reduction in the series resistance and hence an increase in the fill factor and of the efficiency of the solar cell as a result of the reduction of the current load of the individual MIS contacts and of the inversion layer by larger-area, double-surfaced collection of the minority charge carders. In addition, the thickness of the metal layer of the MIS contacts can be reduced.

Instead of the front surface array manufactured at low temperatures and technologically compatible with the back surface array, with MIS contacts and inversion layer, the conventional array too can be used with full-surface $n^+p$-junction or $p^+n$-junction generated by diffusion or ion implantation and with metal contact grid. In this solar cell type, the minority charge carriers are accordingly extracted partly via the front surface $n^+p$-junction or $p^+n$-junction and partly via the back surface minority MIS diodes.

The possibility of truncated pyramids can of course also be used to advantage for the solar cell type designated as back MIS cell (R. Hezel and K. Jaeger, *J. Electrochem. Soc.* 136(2), p. 518 (1989)) collecting only the minority carriers on the back surface. The ohmic contact grid collecting majority carriers can be located on the front surface with truncated pyramids. The great advantage of this is that the area of the actual MIS contact on the back surface can be made very small in the shape of the truncated pyramids. The full-surface metallization covers largely the surface that is very, highly passivated by the insulator layer. At the same time, the metallization represents an outstanding back surface mirror (BSM) for the light not absorbed in the semiconductor.

FIG. 16 shows a further embodiment of a solar cell (258), having on the back surface ohmic contacts (257) and MIS contacts (254) collecting minority and majority charge carriers, respectively.

In order to achieve the structure of the contacts (254) and (257), mechanical processing in accordance with the invention is achieved by wires running preferably parallel to one another and having the necessary spacing and the necessary wire diameter for forming grooves (260) and (262) and hence the elevated areas (264) between these grooves.

In the area of the projections (244) and (245), whose free outer surfaces are provided with a metal layer (248) in order to form the ohmic contacts (257), wire is left out or the spacing of the wires is altered so that the semiconductor substrate (238) is not removed in these areas.

In the embodiment of the back surface of the solar cell (2:58) according to FIG. 16, both the structure of the MIS contacts (254) and the geometry of the ohmic contacts (257) is produced in a single operation.

It should be further mentioned that instead of the inversion layer (253), an n+ layer can be incorporated in a p-semiconductor substrate, where the contacts to n+ can be of the MIS type or ohmic contacts.

Even if FIGS. 12 to 16 show back surfaces of MIS inversion layer solar cells (210), (236), (258), a corresponding back surface structure can also be, selected for solar cells of the pn type.

Structuring in accordance with the invention preferably by means of parallel wires or other mechanical structuring elements is of course not restricted to semiconductor material; any material having to be structured to the required extent, particularly those materials used in optical applications, can be processed in accordance with the invention.

It is also possible—corresponding to the embodiment in FIG. 4—to structure the carrier of the solar cell in accordance with the invention.

Structuring of this type was used for the solar cell shown in section in FIG. 17. A carrier substrate (268) was structured by mechanical means in the previously described way, i.e. in particular by means of parallel-disposed sawblades, wires or also using a gang saw, in order to generate elevated areas (274) between the grooves (270) and (272).

Once the structure has been provided, the entire surface is covered with a passivation layer (276) that serves as a diffusion barrier. Suitable materials are, for example, silicon nitride or aluminum oxide. The passivation layer (276) is then removed in the area of the elevations (274), for example by grinding, so that the substrate (268) is exposed over a small area. A semiconductor layer (278) is then deposited over the full area of the structured surface of the substrate (268), thereby forming at the same time a good small-surface ohmic contact with the substrate (268). In the remaining large surfaces, however, a reaction between the substrate material and the semiconductor film (278) is ruled out. This means that impurities cannot diffuse into the semiconductor material.

A solar cell can then be built up on the semiconductor film (278) that corresponds to that in FIG. 4, for example. An MIS inversion layer solar cell can of course also be built up on the semiconductor film.

It must also be pointed out that when a monocrystalline initial substrate is used, it is possible to form an epitaxy layer following application of the passivation layer (274) and at least partial removal of the latter from the elevated areas (276) by nucleation in, the openings. A procedure of this type is however of particular advantage when a pyramid structure is provided instead of linear elevated areas, so that the epitaxy layer starts from the pyramid tips.

The measures described above result in the advantage that only a few impurities from the crystalline, lower-grade semiconductor material can diffuse into the epitaxy layer, since the greater part of the substrate surface, preferably more than 95%, is covered by the passivation layer (276).

I claim:

1. A method for manufacturing a solar cell comprising a semiconductor substrate in which charge carriers can be generated by incident radiation energy and electrically conducting contacts for conducting said charge carriers, comprising the steps of:

forming a plurality of elevated areas on at least one surface of a said semiconductor substrate;

substantially completely covering said at least one semiconductor substrate surface with a passivation layer;

at least partially removing said passivation layer present on said elevated areas; and forming said electrically conducting contacts indirectly or directly at least on the portions of the elevated areas thus exposed and on portions of said passivation layer located on flanks extending from the elevated areas; wherein said elevated areas are formed without masking by mechanical removal and/or etching of said semiconductor material and at least said passivation layer is removed from said elevated areas whereby plateau-like areas are formed, from whose free upper surface the flanks extend and in which semiconductor material is exposed.

2. A method according to claim 1, wherein
said electrically conducting contacts are deposited on said plateau-like areas of said elevated areas without using a special mask, and on at least one of said flanks.

3. A method according to claim 1, wherein
removal at least of said passivation layer is achieved by at least one of mechanical or chemical-mechanical erosion by ion bombardment and etching by ions, laser or plasma.

4. A method according to claim 1, wherein semiconductor material is removed together with said passivation material.

5. A method according to claim 1, wherein
said elevated areas strip-shaped, the material forming the said electrically conducting contacts are formed on substantially every elevated area, and the width of sad plateau-like areas is greater than double the thickness of said passivation layer.

6. A method according to claim 1, wherein said passivation layer and optionally semiconductor substrate material are removed substantially simultaneously from a plurality of elevated areas.

7. A method according to claim 1, wherein said electrically conducting contacts are deposited in a vacuum at an angle $\alpha$ with $90° > \alpha > 0°$ in relation to a plane formed by said plateau-like areas.

8. A method according to claim 7 wherein said electrically conducting contacts are disposed at an angle $\alpha$ with $30° > °C > 1°$.

9. A method according to claim 1, wherein said electrically conducting contacts are deposited electrolytically by currentless metallization.

10. A method according to claim 1, wherein said elevated areas are formed by removal of semiconductor material or of a carrier provided therewith, by means of sawblades or wires disposed parallel and moved relative to said semiconductor material or carrier, or by means of gang saws.

11. A method according to claim 1, wherein said passivation layer is used as a mask for further layers to be applied or formed.

12. A method according to claim 11 wherein said passivation layer is used as a mask for the material forming the electrically conducting contacts.

13. A method according to claim 11 wherein said passivation layer is used as a mask for diffusion or ion implantation of doped surface layers in said semiconductor substrate.

* * * * *